US008410380B2

(12) United States Patent
Yeh et al.

(10) Patent No.: US 8,410,380 B2
(45) Date of Patent: *Apr. 2, 2013

(54) SWITCH STRUCTURE ON SIDEWALL OF CIRCUIT BOARD FOR ELECTRONIC DEVICE

(75) Inventors: Chih-Feng Yeh, Taipei (TW); Wen-Nan Hsia, Taipei (TW); Cheng-Ju Lee, Taipei (TW)

(73) Assignee: Wistron Corp., Hsichih, Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/481,596

(22) Filed: May 25, 2012

(65) Prior Publication Data

US 2012/0228100 A1 Sep. 13, 2012

Related U.S. Application Data

(63) Continuation of application No. 12/499,471, filed on Jul. 8, 2009, now Pat. No. 8,207,461.

(30) Foreign Application Priority Data

Feb. 20, 2009 (TW) ................................ 98105445 A

(51) Int. Cl.
*H01H 1/20* (2006.01)

(52) U.S. Cl. ........................................................ 200/243
(58) Field of Classification Search ................. 200/243; 361/781; 439/945, 946
See application file for complete search history.

(56) References Cited

U.S. PATENT DOCUMENTS

| 5,495,393 A | 2/1996 | Inoue |
| 2005/0272491 A1 | 12/2005 | Jeon |
| 2008/0237009 A1* | 10/2008 | Weisz-Margulescu et al. ................ 200/302.1 |

FOREIGN PATENT DOCUMENTS

CN 1707713 A 12/2005

* cited by examiner

*Primary Examiner* — Vanessa Girardi
(74) *Attorney, Agent, or Firm* — Muncy, Geissler, Olds & Lowe, PLLC

(57) ABSTRACT

A switch structure on the sidewall of a circuit board for an electronic device and manufacturing methods of the circuit board are provided. The switch structure includes a circuit board, a plurality of conductive portions, and a movable unit. The conductive portions are formed on a sidewall of the circuit board and electrically insulated from each other. The movable unit is disposed corresponding to the conductive portions to electrically connect or disconnect the plurality of conductive portions to achieve the switch function. The switch structure utilizes the structural design of the circuit board to reduce the space on the circuit board preserved for a circuit board switch.

30 Claims, 25 Drawing Sheets

SWITCH STRUCTURE ON SIDEWALL OF CIRCUIT BOARD FOR ELECTRONIC DEVICE

CROSS REFERENCE TO RELATED APPLICATIONS

This application is a Continuation of application Ser. No. 12/499,471 filed on Jul. 8, 2009, now U.S. Pat. No. 8,207,461 for which priority is claimed under 35 U.S.C. §120; and this application claims priority of Application No. 098105445 filed in Taiwan on Feb. 20, 2009, the entire contents of which are hereby incorporated by reference.

BACKGROUND OF THE INVENTION

1. Field of the Invention

The present invention relates to a switch structure on a sidewall of a circuit board for an electronic device; more particularly, the present invention relates to a circuit board switch on a sidewall of a circuit board and manufacturing methods of the circuit board.

2. Description of the Related Art

As the trend of developing electronic products focuses on light weight and small size, the volume of circuit boards is accordingly restricted. Therefore, circuit boards and electronic components thereon also become miniature. The widespread use of flexible printed circuit boards (FPCs) and applications thereof is a result of recent developments, for example.

However, in conventional designs, the circuit board switch is generally an electronic component required of large space to be mounted on the circuit board. In order to reduce the required space for the circuit board switch, many solutions have been proposed. FIG. 1 shows a conventional circuit board switch of a rigid printed circuit board (RPC). As shown in FIG. 1, a conventional circuit board switch 1 is disposed on a circuit board 2 by surface mount technology (SMT) or dual in-line package (DIP) to be triggered by pressing the button 3.

FIG. 2 shows a conventional circuit board switch of a rigid-flexible printed circuit boards (RFPCB). As shown in FIG. 2, in this design, the switch function of the circuit board switch is achieved by pressing the button 4 to trigger the metal dome 6 of the circuit board 5. In addition to the employment of the additional metal dome, there are still other restrictions on designing rigid-flexible printed circuit boards, such as minimum bending angle or minimum length of the flexible printed circuit board.

SUMMARY OF THE INVENTION

It is an objective of the present invention to provide a switch structure of an electronic device and manufacturing methods of a circuit board having the switch structure, which overcomes the above-mentioned problems so as to reduce the space on the circuit board preserved for the circuit board switch.

In one embodiment of present invention, a switch structure of an electronic device includes a circuit board, a plurality of conductive portions, and a movable unit. The conductive portions are formed on a sidewall of the circuit board and electrically insulated from each other. The movable unit is disposed corresponding to the conductive portions and is movable to selectively connect and disconnect the conductive portions so as to achieve the switch function. The switch structure utilizes the structural design of the circuit board to achieve the switch function so as to reduce the space on the circuit board preserved for the circuit board switch and to save the cost of employing conventional circuit board switches and metal dorms.

The manufacturing method of the circuit board of the present invention includes the following steps: forming a plurality of conductive portions on a sidewall of a circuit board, so that the plurality of conductive portions are electrically insulated from each other; disposing a movable unit corresponding to the conductive portions, wherein the movable unit is movable to selectively connect and disconnect the conductive portions so as to achieve the switch function.

DETAILED DESCRIPTION OF THE PREFERRED EMBODIMENT

The invention provides a switch structure of an electronic device and manufacturing methods of a circuit board having the switch structure. In an embodiment, the switch structure is applied to various printed circuit boards (PCBs), such as FPC, RPC, RFPCB, etc.

Figure 1:
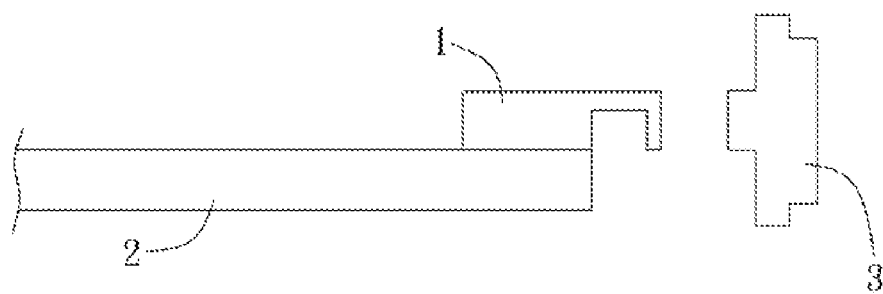
FIG. 1 shows a conventional circuit board switch of a rigid printed circuit board.
Figure 2:
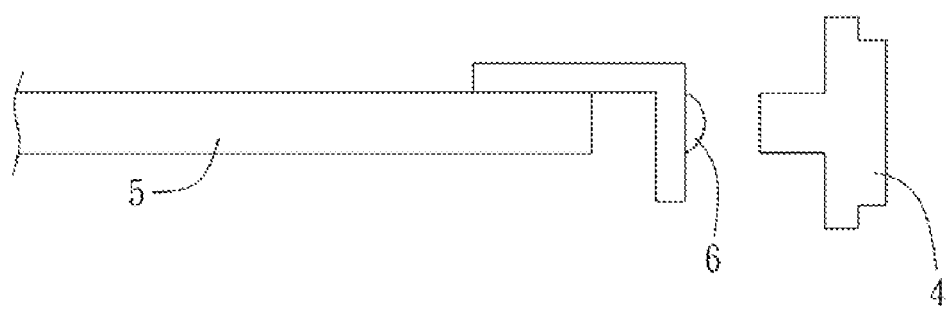
FIG. 2 shows a conventional circuit board switch of a rigid-flexible printed circuit board.
Figure 3A:
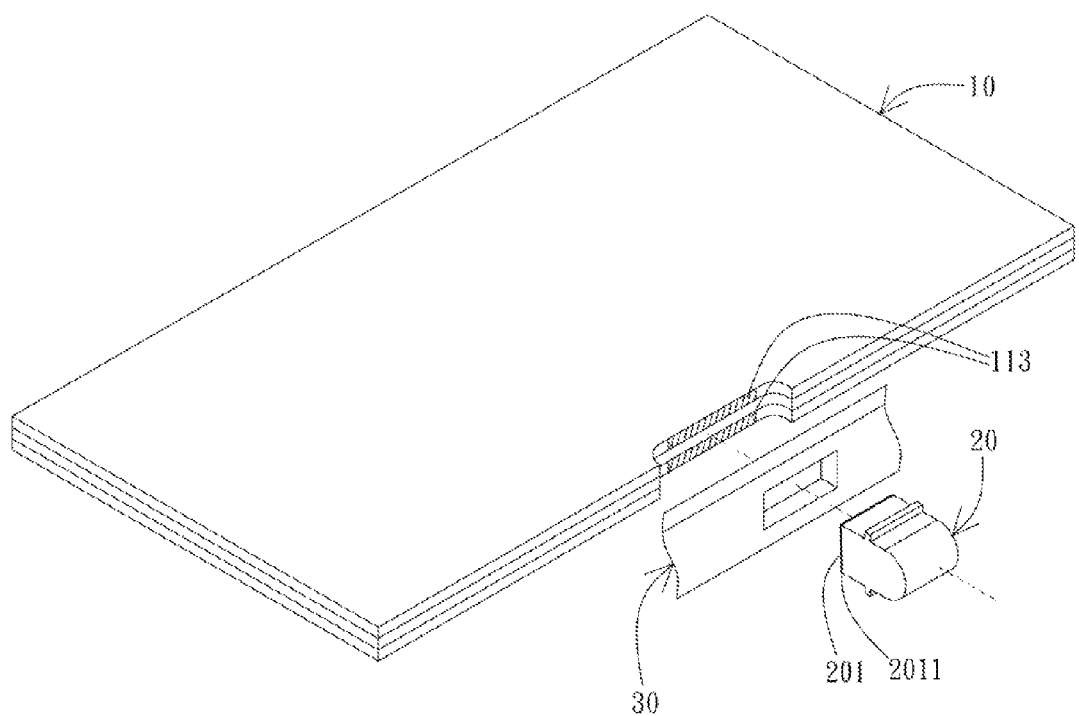
FIG. 3A shows an exploded view of a first embodiment of a switch structure of an electronic device of the invention.
Figure 3B:
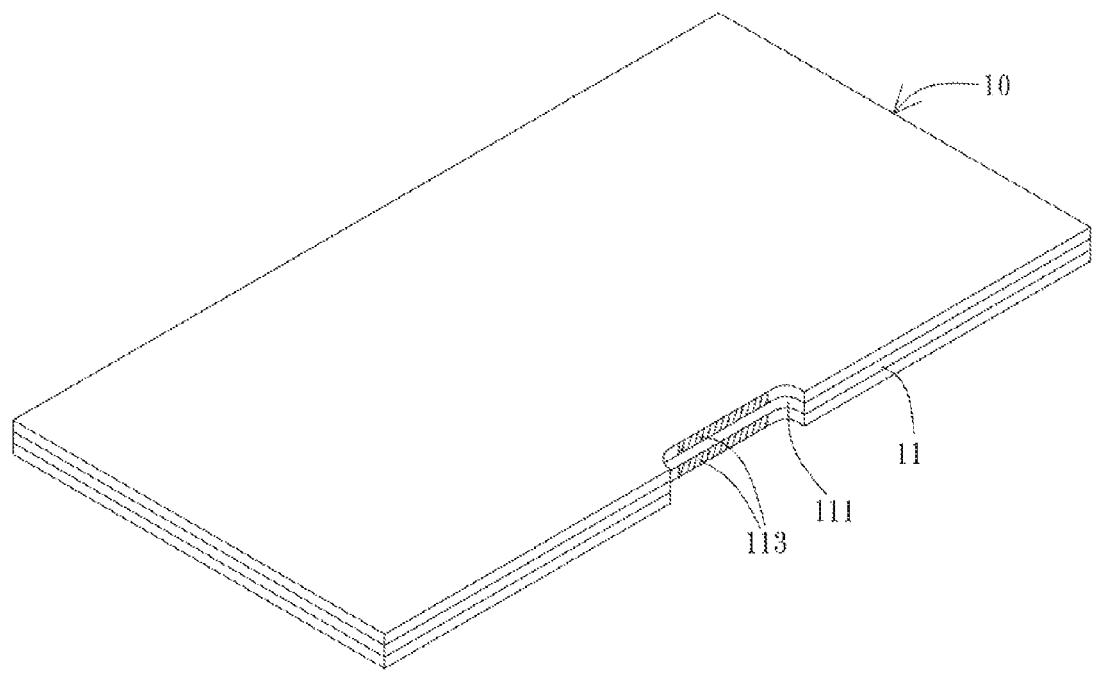
FIG. 3B shows a side view of the embodiment shown in FIG. 3A.

FIG. 3A shows an exploded view of a first embodiment of a switch structure of an electronic device of the invention. As shown in FIG. 3A, the switch structure includes a circuit board 10, a movable unit 20 having a conducting part 201, and a housing 30. FIG. 3B shows a side view of the embodiment shown in FIG. 3A. As shown in FIG. 3B, the circuit board 10 includes a sidewall 11, a groove 111 formed on the sidewall 11, and two conductive portions 113 formed on the sidewall in the groove 111. The conductive portions 113 are electrically insulated from each other. For example, the conductive portions 113 can be conductive pins, leads, sections, layers, coatings, etc.

Figure 4A:
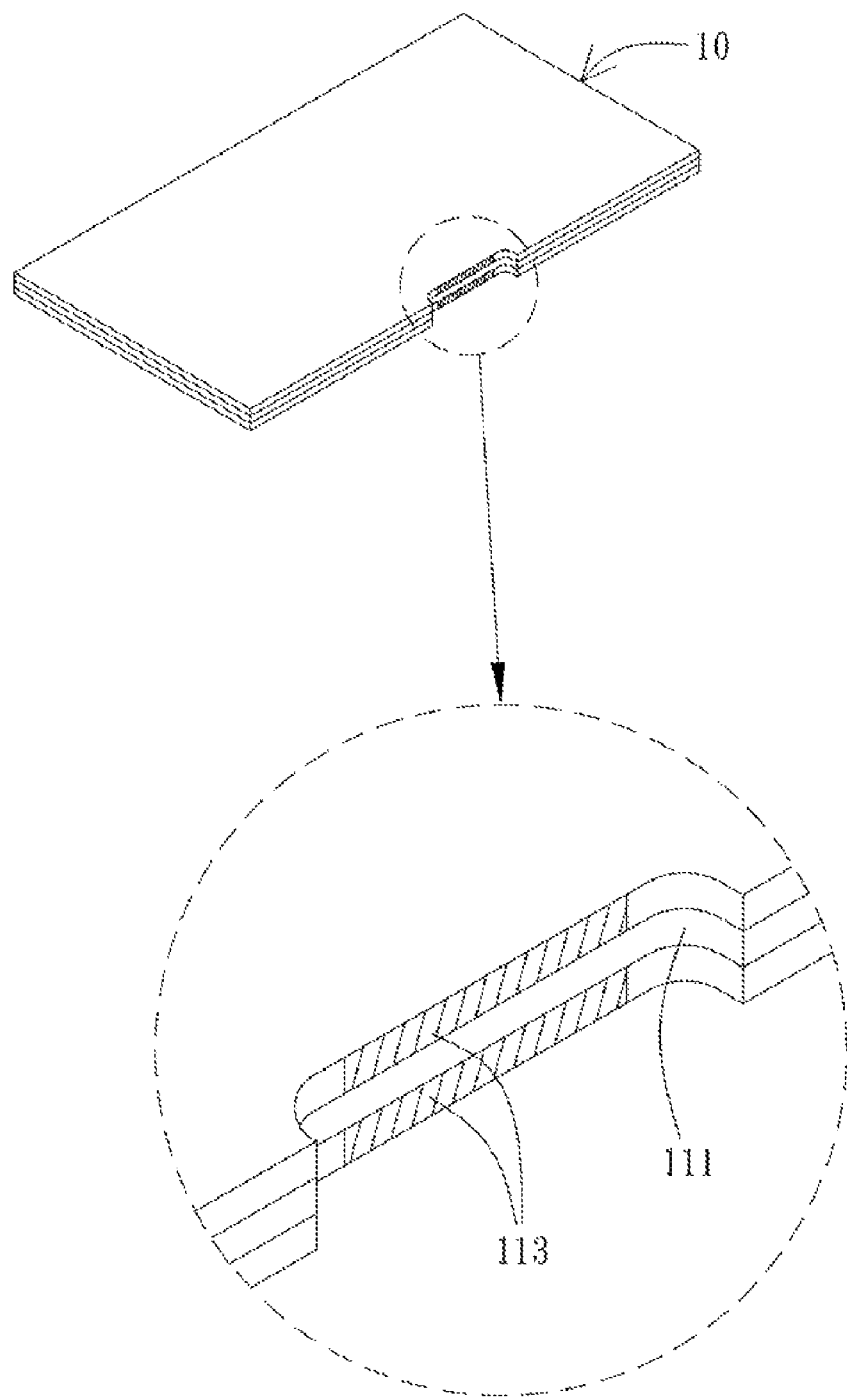
FIG. 4A shows a side view of an exemplary conductive portions which is horizontally disposed in the groove.
Figure 4B:
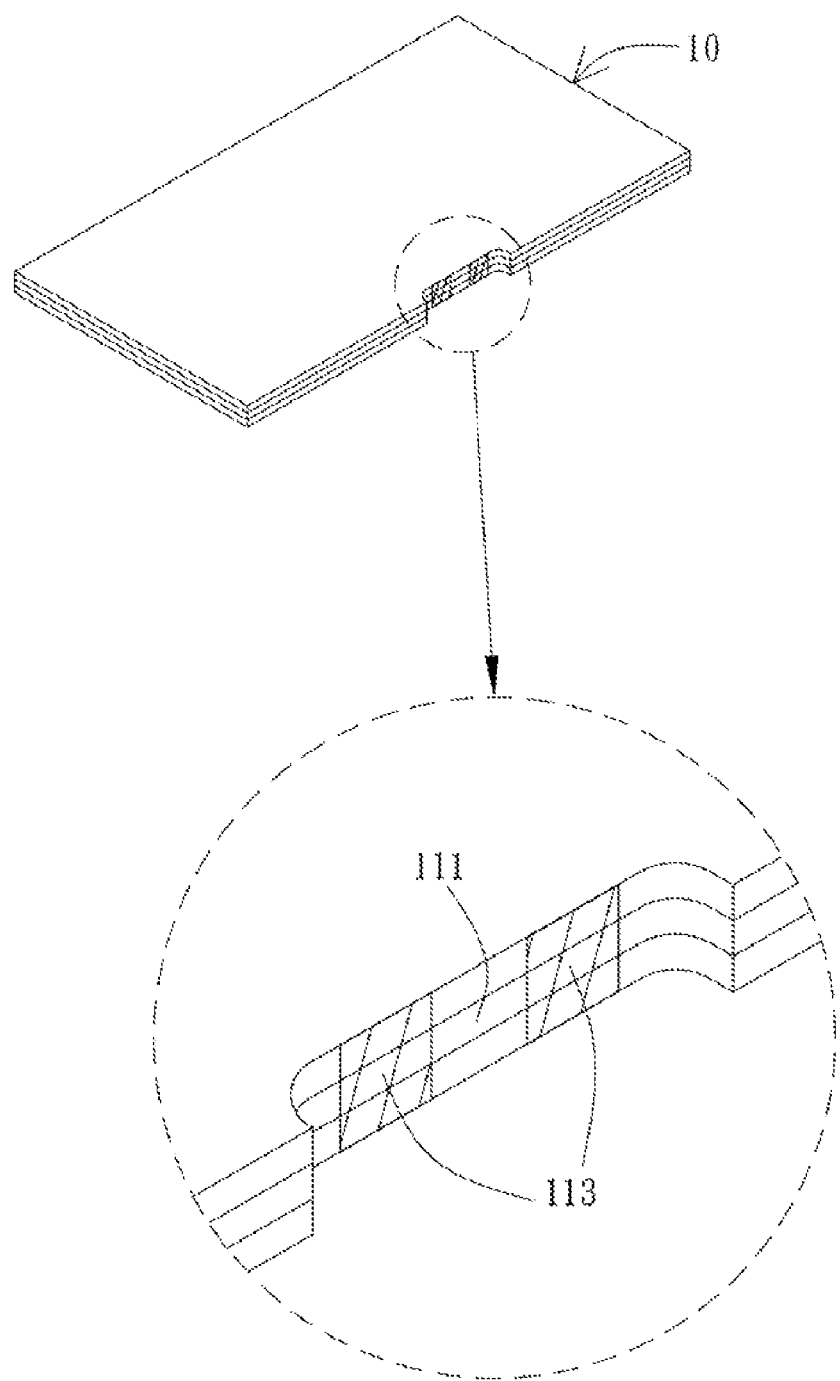
FIG. 4B shows a side view of an exemplary conductive portions which is vertically disposed in the groove.
Figure 4C:
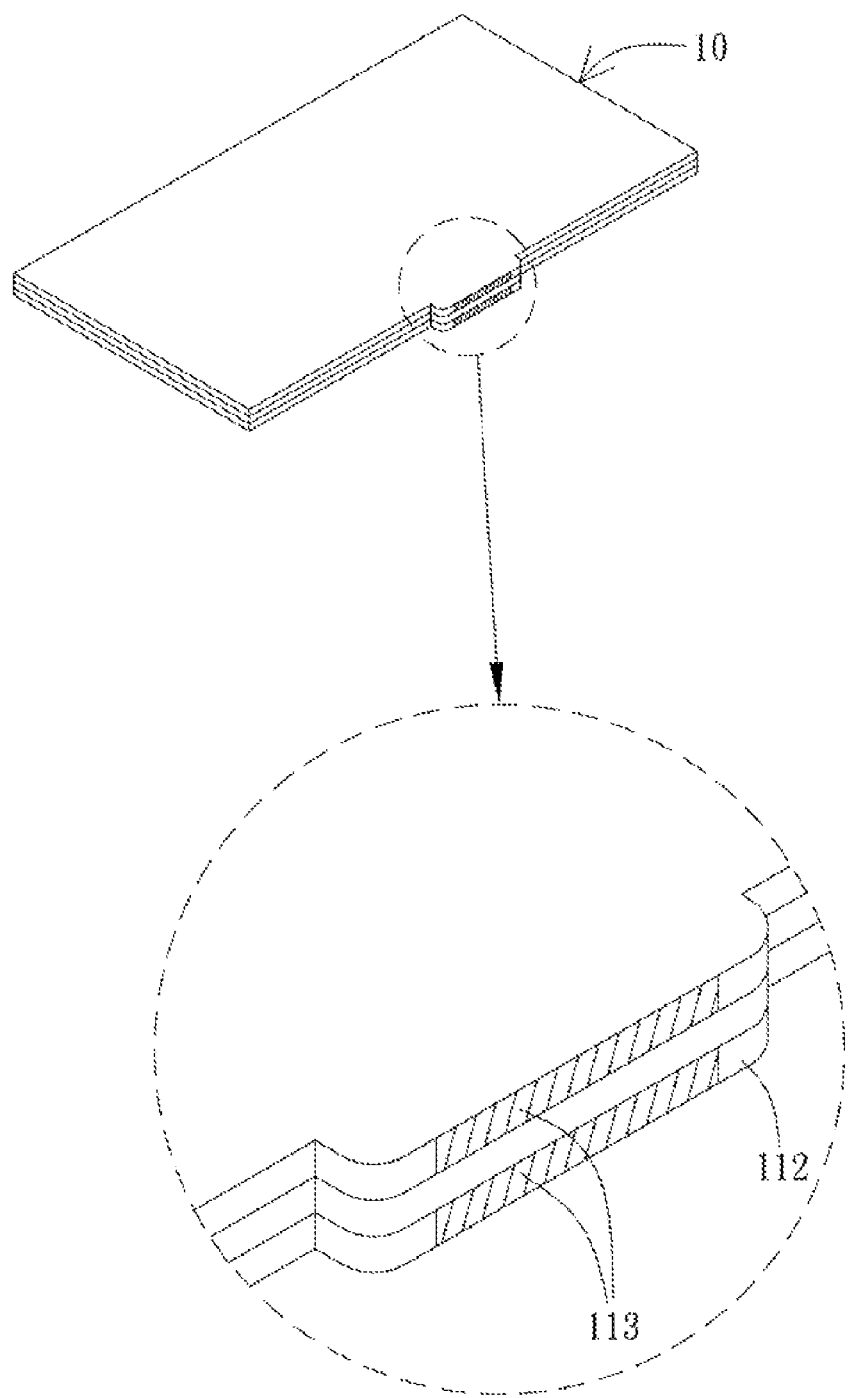
FIG. 4C shows a side view of an exemplary conductive portions which is horizontally disposed on the flange.
Figure 4D:
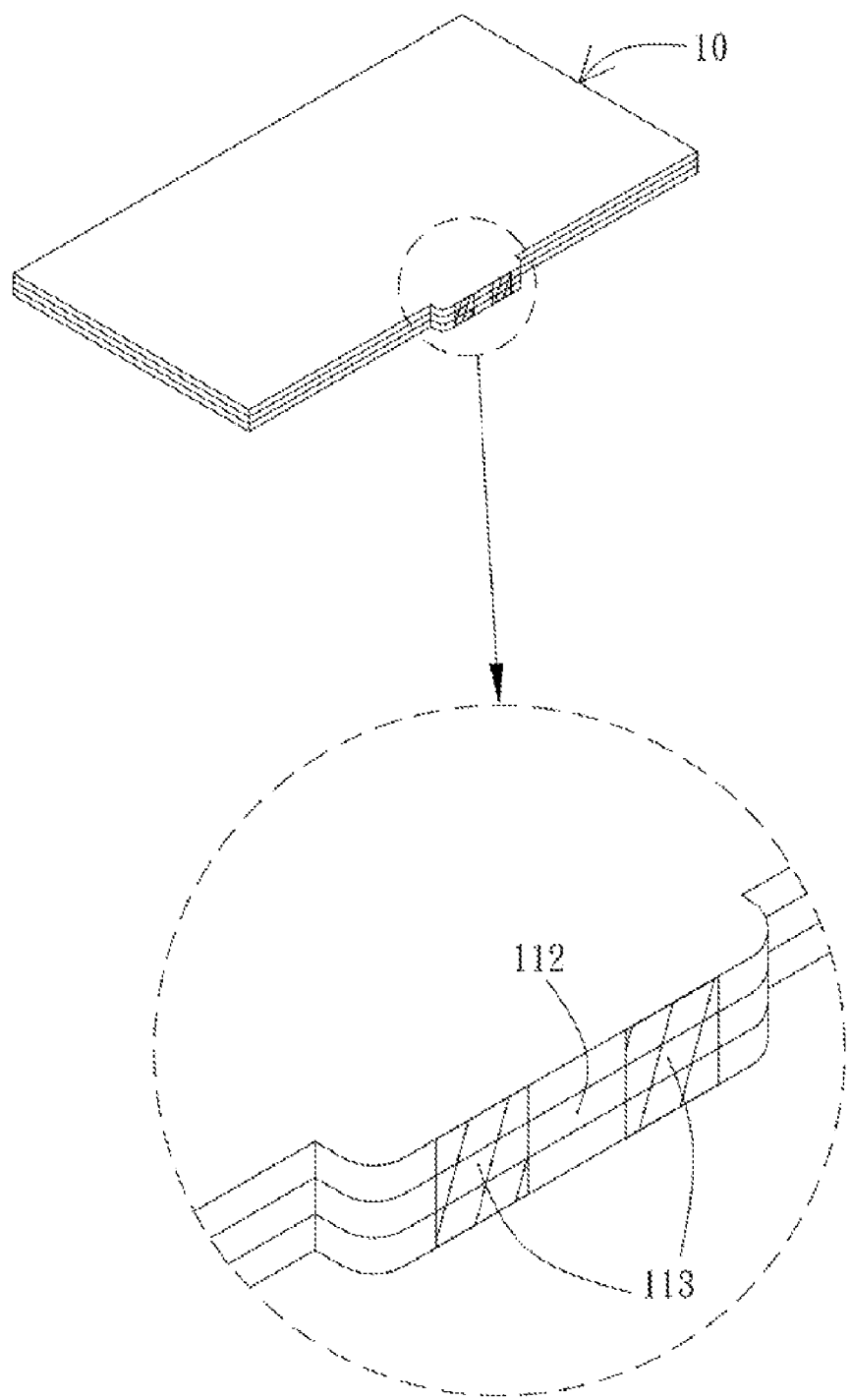
FIG. 4D shows a side view of an exemplary conductive portions which is vertically disposed on the flange.
Figure 4E:
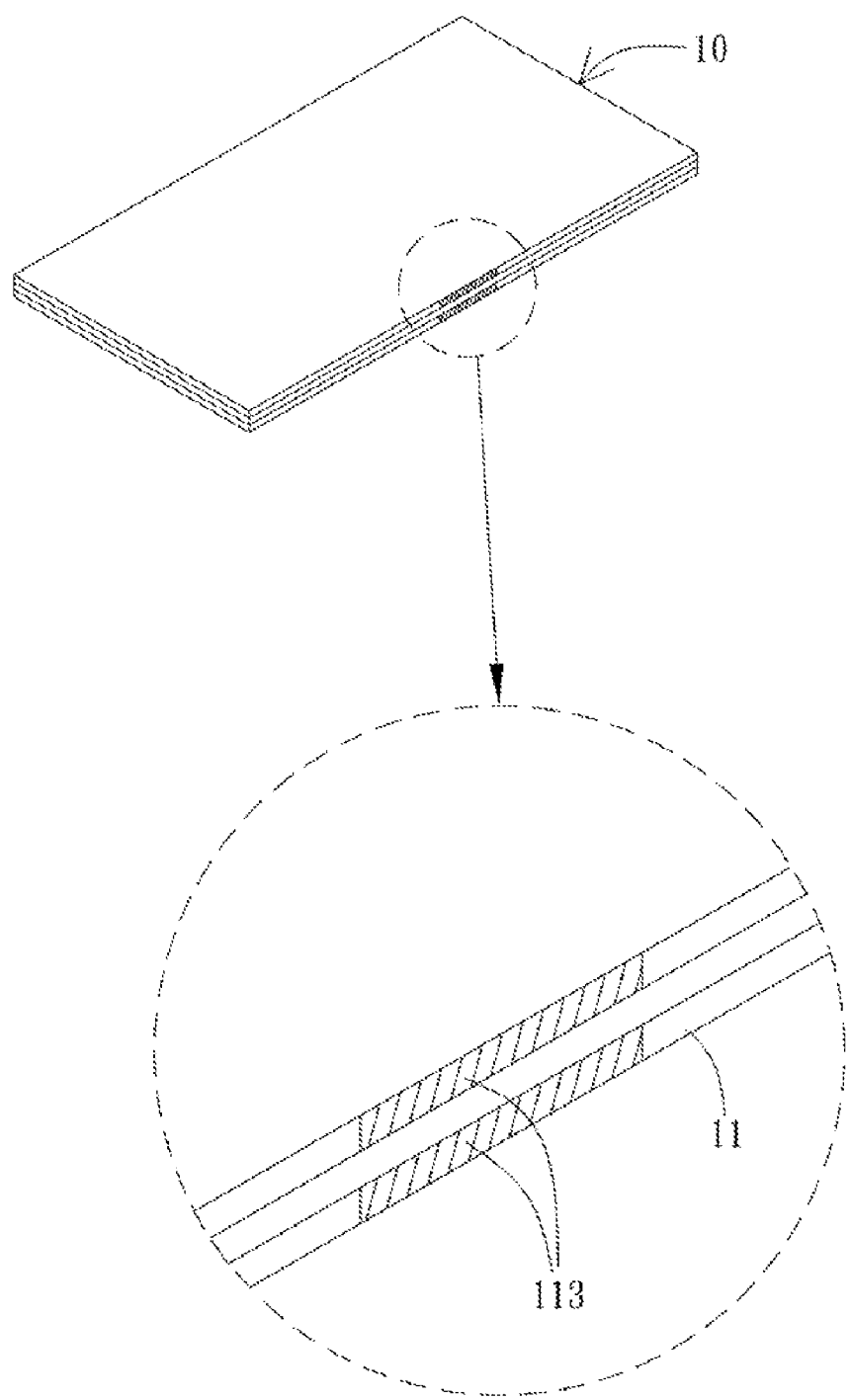
FIG. 4E shows a side view of an exemplary conductive portions which is horizontally disposed on the sidewall of the circuit board.
Figure 4F:
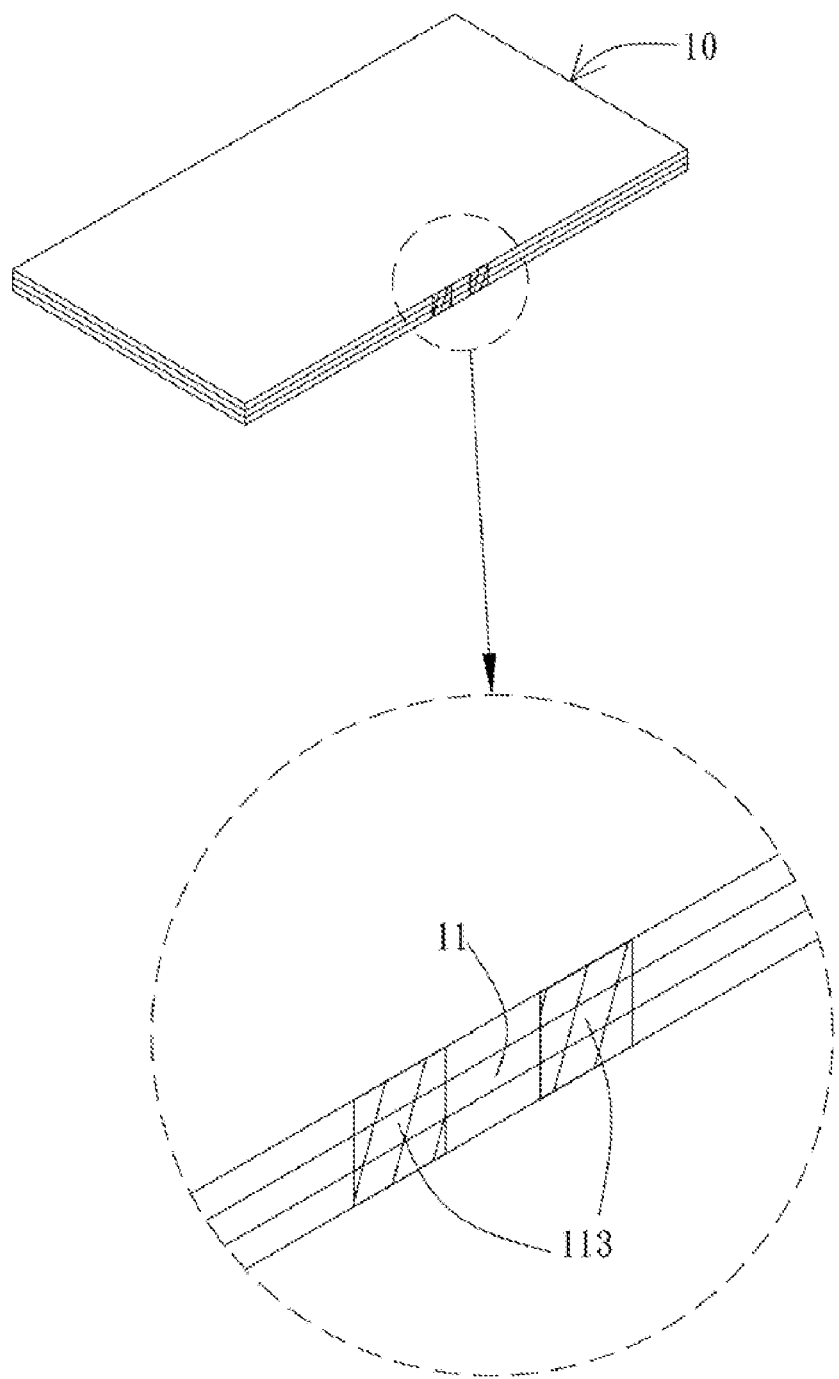
FIG. 4F shows a side view of an exemplary conductive portions which is vertically disposed on the sidewall of the circuit board.

The conductive portions can be formed in various manners, so that the conductive portions are respectively formed on at least one of the sidewalls of circuit layers and electrically isolated from each other. For example, the conductive portions 113 can be formed in the groove 111. As shown in FIG. 4A, two conductive portions 113 can be formed on the upper edge and the lower edge of the sidewall 11 in the groove 111, respectively, and horizontally spaced apart. Alternatively, as shown in FIG. 4B, two conductive portions 113 can be formed on the sidewall 11 across the upper edge and the lower edge of the groove 111 and vertically spaced apart. In other embodiments, the conductive portions 113 can be formed on a flange. As shown in FIG. 4C, two conductive portions 113 can be formed on the sidewall 11 of a flange 112 and horizontally spaced apart. Alternatively, as shown in FIG. 4D, two conductive portions 113 can be formed on the sidewall 11 across the upper edge and the lower edge of the flange 112 and vertically spaced apart. In yet another embodiment, the conductive portions 113 can be directly formed on a flat sidewall of the circuit board instead of the sidewall of a groove or a flange. As shown in FIG. 4E, two conductive portions 113 can be formed on the sidewall 11 and horizontally spaced apart. Alternatively, as shown in FIG. 4F, two conductive portions 113 can be formed on the sidewall 11 and vertically spaced apart.

Figure 3C:
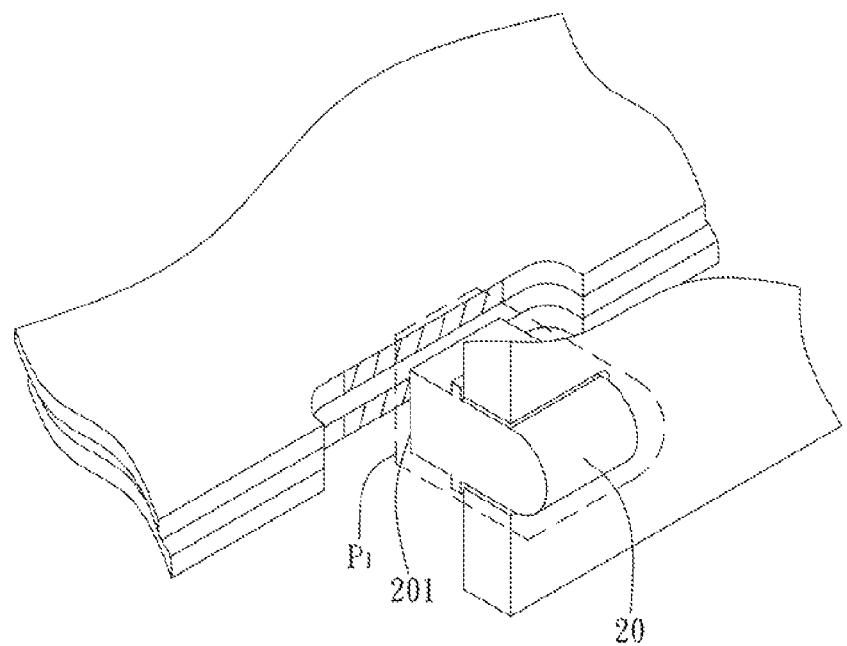
FIG. 3C shows a prospective view of the movable unit shown in FIG. 3A when the body is at a first position $P_1$.
Figure 3D:
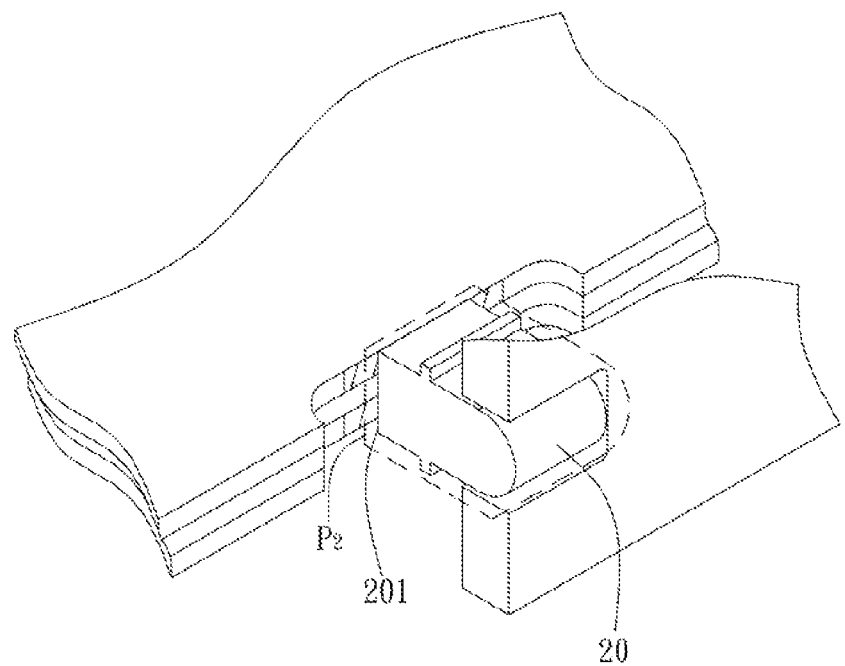
FIG. 3D shows a prospective view of the movable unit shown in FIG. 3A when the body is at a second position $P_2$.

As shown in FIG. 3A, the movable unit 20 includes a body 20, which can be, for example, a button of a switch, and the conducting part 201 can be a conductive surface on the body. The body 20 is disposed on the housing 30 at a position corresponding to the conductive portions 113. FIG. 3C and FIG. 3D show prospective views of the movable unit shown in FIG. 3A when the body is at a first position $P_1$ and a second position $P_2$, respectively. As shown in FIG. 3C and FIG. 3D, the movable unit 20 can be moved between the first position $P_1$ and the second position $P_2$. When the body 20 is pressed, the body 20 moves from the first position $P_1$ to the second position $P_2$, so that the conducting part 201 of the body 20 contacts the two conductive portions 113 causing an electrical connection. In this embodiment, the body 20 can be made of metal, electrically conductive rubber, graphite or, alternatively, conductive materials. When the body 20 is made of conductive materials, the conducting part 201 can simply be a surface of the body 20. However, in other embodiments, the body 20 can be made of non-conducting materials with a conductive element 2011 disposed thereon. In such a case, the conducting part 201 can be the surface of the conductive element 2011. When the body 20 is pressed, the conductive element 2011 contacts the two conductive portions 113, so that the two conductive portions 113 become electrically connected, and therefore, the switch function is achieved. The conductive element 2011 can be a conductive layer coated on the non-conducting material or a metal slice attached to the non-conducting material. The housing 30 fixes the body 20 at a position corresponding to the two conductive portions 113 and assists the body 20 in achieving the switch function.

Figure 5A:
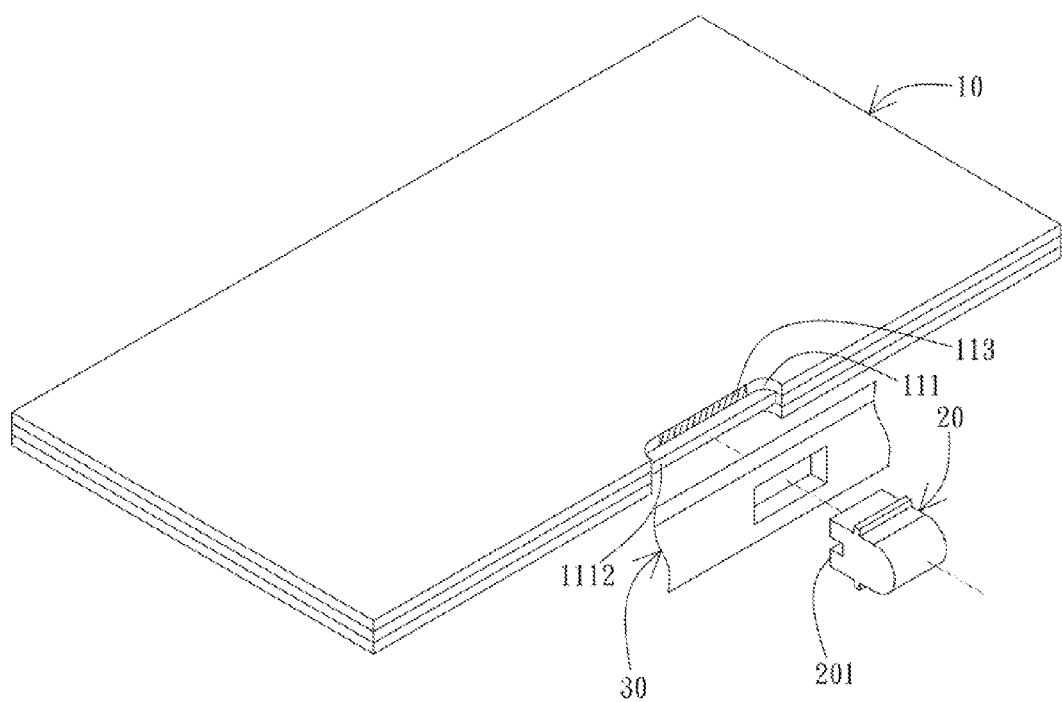
FIG. 5A shows an exploded view of a second embodiment of the movable unit.
Figure 5B:
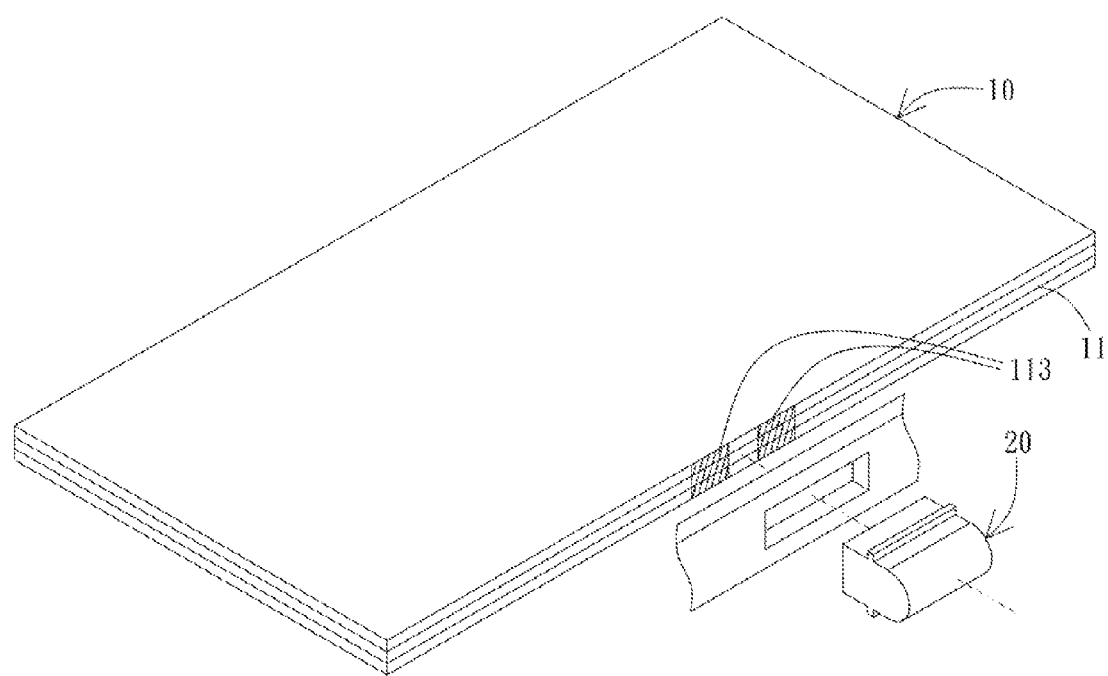
FIG. 5B shows an exploded view of a third embodiment of the movable unit.

In order to electrically connect or disconnect the conductive portions, the shape of the conducting part 201 can be modified accordingly. As shown in FIG. 3A, the surface of the groove 111 where the conductive portions 113 are formed is flat, and the conducting part 201 which corresponds to the two conductive portions 113 also has a flat surface. However, in other embodiments, the shape of the conducting part 201 can be modified according to the surface where the conductive portions 113 are formed. FIG. 5A shows an exploded view of a second embodiment of the movable unit. As shown in FIG. 5A, a protrusion 1112 is disposed in the middle of the groove 111 to divide the groove 111 into two recesses. In this case, the conducting part 201 is formed in a concave shape for corresponding to the protrusion 1112. That is, the body 20 is formed with a recessed portion. When the body 20 is pressed, the protrusion 1112 is allowed to be inserted into the recessed portion of the body 20, so that the conducting part 201 contacts the two conductive portions 113 causing the two conductive portions 113 to become electrically connected. Furthermore, the shape of body 20 can be modified according to the layout of conductive portions 113. FIG. 5B shows an exploded view of a third embodiment of the movable unit of the switch structure. As shown in FIG. 5B, the two conductive portions 113 can be vertically formed on the sidewall 11. In this case, the body 20 can have an elongated shape so that the body 20 can contact the two conductive portions 113 simultaneously causing the two conductive portions 113 to become electrically connected.

Figure 6:
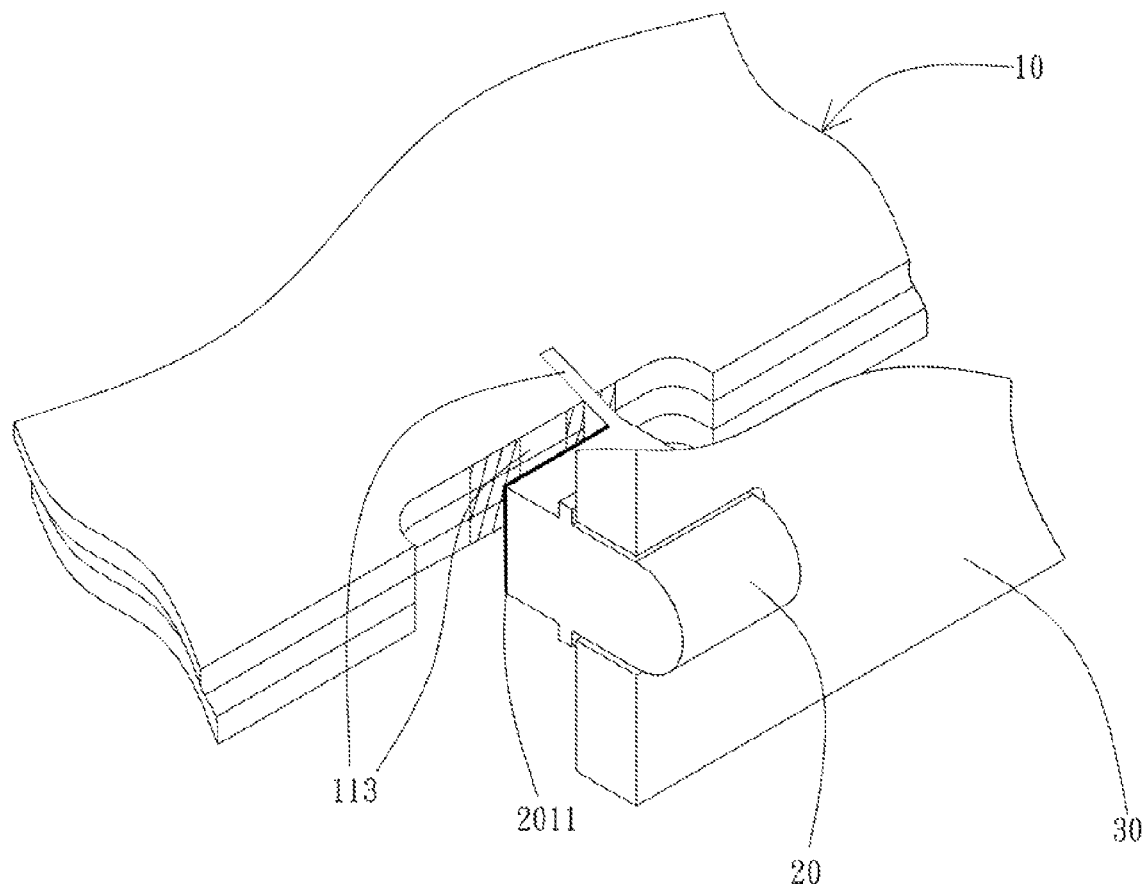
FIG. 6 shows an exploded view of a fourth embodiment of the movable unit.

In other embodiments, the movable unit can be disposed in a manner that the movable unit is electrically connected to one of the conductive portions. FIG. 6 shows an exploded view of a fourth embodiment of the movable unit of the switch structure. As shown in FIG. 6, a portion of the movable unit 20 is electrically connected to one of the two conductive portions 113 while the other portion can be moved selectively. Pressing the movable unit 20 causes the two conductive portions 113 to become electrically connected. In this embodiment, the movable unit 20 is a body of non-conducting material with a conductive element 2011 disposed thereon. In such a case, pressing the body 20 causes the conductive element 2011 to contact the two conductive portions 113 so that the two conductive portions 113 become electrically connected, and the switch function is therefore achieved. However, in other embodiments, the movable unit 20 is a body of metal, electrically conductive rubber, graphite, or other conductive materials, wherein one end of the body is welded or soldered with one of the two conductive portions 113, and the other end is free from moving. Therefore, by moving the body 20 between the first position $P_1$ and the second position $P_2$, the two conductive portions 113 are selectively connected and disconnected.

Figure 7A:
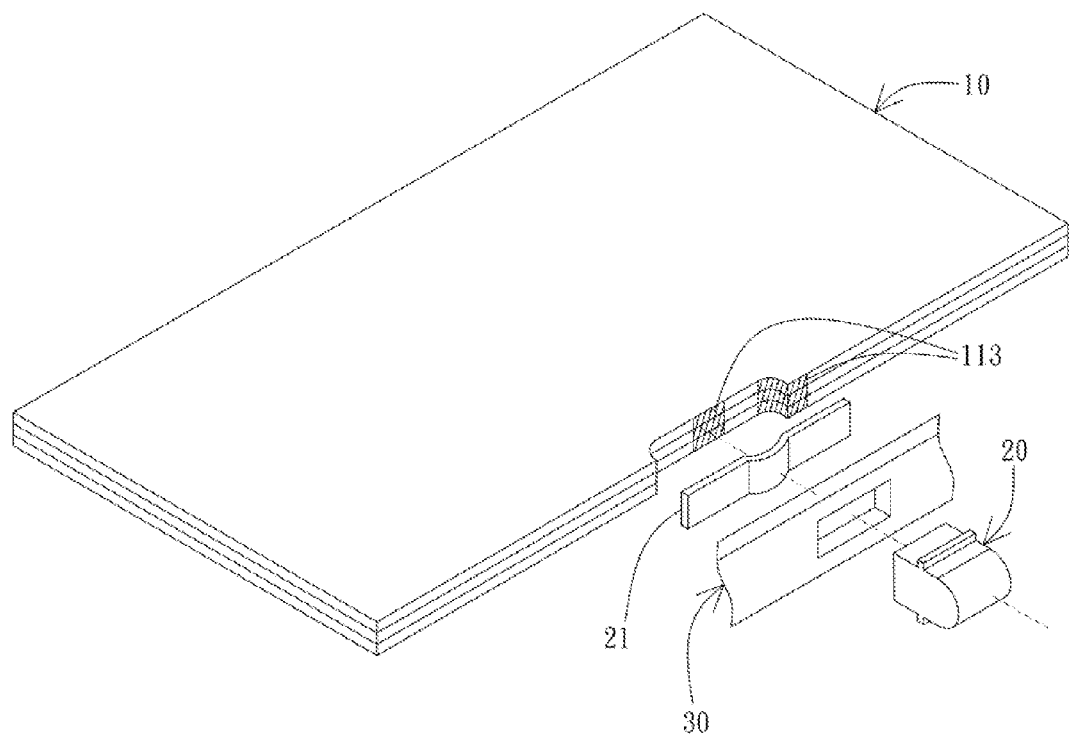
FIG. 7A shows an exploded view of a fifth embodiment of the movable unit.
Figure 7B:
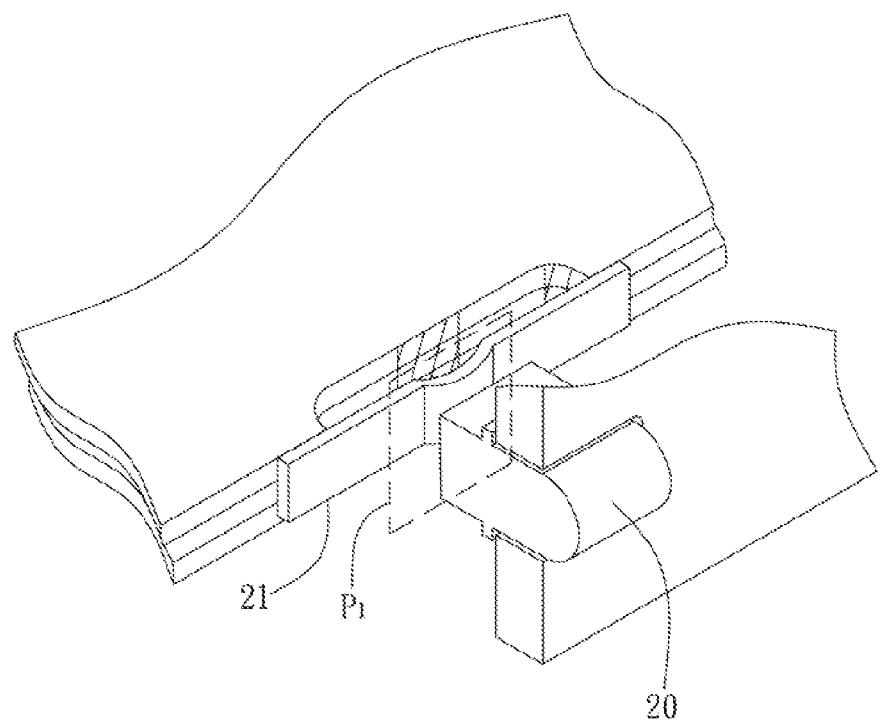
FIG. 7B shows a schematic view of the metal plate of FIG. 7A while the metal plate is at the first position $P_1$.
Figure 7C:
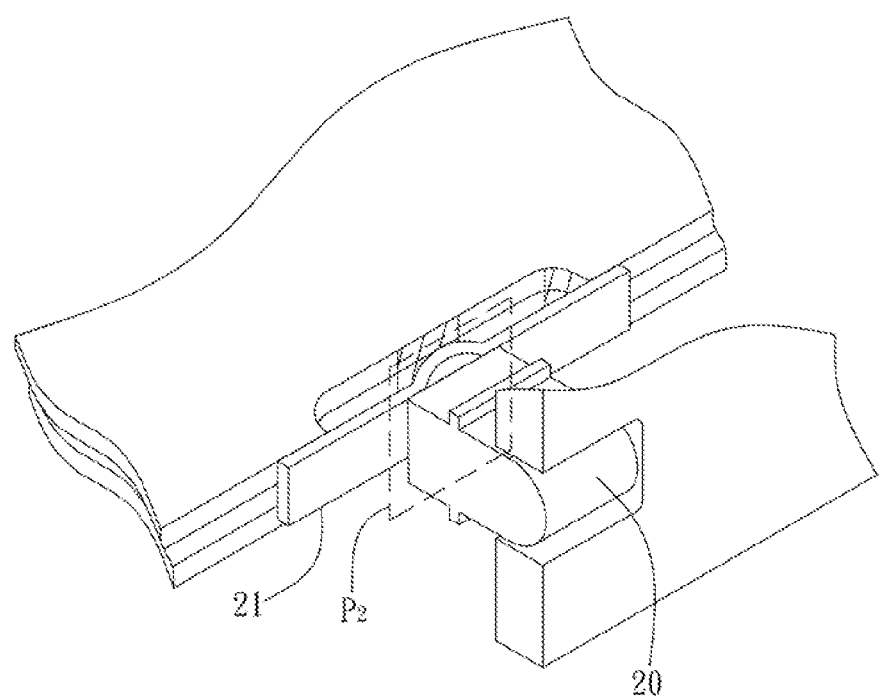
FIG. 7C shows a schematic view of the metal plate of FIG. 7A while the metal plate is at the second position $P_2$.

Furthermore, in other embodiments, a metal plate can be disposed between the body and the conductive portions so that the conductive portions can become electrically connected through the metal plate. The advantage of using the metal plate is to provide the user with a button touch feeling due to the elasticity of the metal plate. FIG. 7A shows an exploded view of a fifth embodiment of the movable unit of the switch structure. As shown in FIG. 7A, a portion of the metal plate 21 is electrically connected to one of the two conductive portions 113 while the other portion is fixed on the sidewall 11. FIG. 7B and FIG. 7C show schematic views of the movable unit 20 of FIG. 7A when the body is at the first position $P_1$ and the second position $P_2$ respectively. As shown in FIG. 7B and FIG. 7C, pressing the body 20 causes the metal plate 21 to deform and move from the first position $P_1$ to the second position $P_2$, so that the metal plate 21 contacts the other one of the two conductive portions 113 causing the two conductive portions 113 to become electrically connected. In this embodiment, the material of the body 20 is not restricted to conductive material, and the metal plate 21 can serve as the conducting part.

Figure 8:
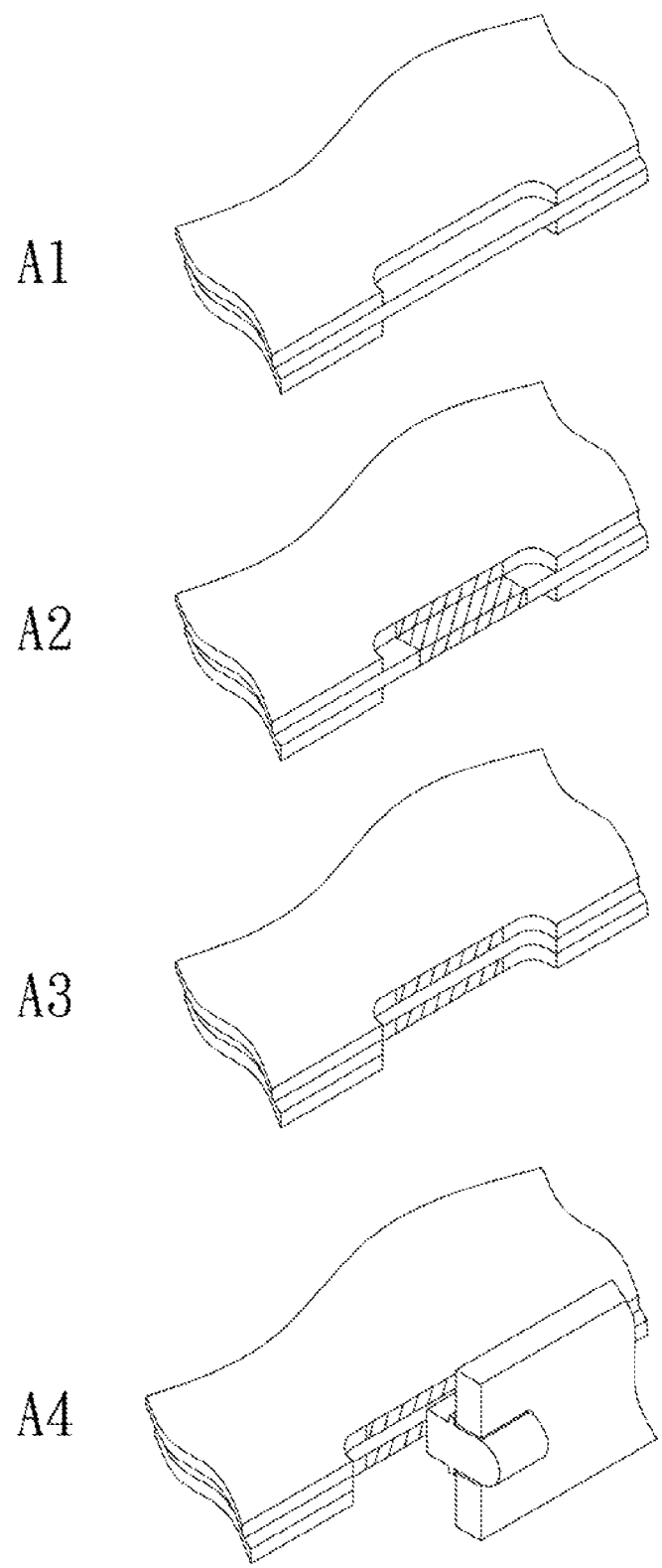
FIG. 8 shows a schematic view of a first exemplary method of manufacturing the circuit board of the invention.

FIG. 8 shows a schematic view of a first exemplary method of manufacturing the circuit board of the invention. As shown in FIG. 8, Step A1 includes stacking a first layer, a second layer, and a third layer, so that the second layer is sandwiched between the first layer and the third layer. A recess is provided on a sidewall of the first layer and the third layer, respectively. The recessed sidewalls of the first and the third layers are aligned with the second layer interposed therebetween to form a circuit board having a protrusion between two recesses on the sidewall. Step A2 includes forming a metal coating on the sidewall of the circuit board. Step A3 includes removing a portion of the metal coating to remain a portion of the metal coating in the recesses, so as to form a first conductive portion and a third conductive portion which are electrically insulated from each other. As shown in FIG. 8, in step A3, removing a portion of the metal coating includes removing a portion of the second layer which is the protrusion between the recesses, so that a circuit board similar to FIG. 3B can be formed. Step A4 includes adjusting the circuit board by disposing a movable unit (e.g. body 20) on a housing to correspond to the first conductive portion and the third conductive portion. When the movable unit is pressed, the movable unit contacts the first conductive portion and the third conductive portion, so that the first and the third conductive portions become electrically connected. As shown in FIG. 3C and FIG. 3D, when the body 20 is pressed, the body 20 moves from the first position $P_1$ to the second position $P_2$, so that the conducting part 201 of the body 20 contacts the two conductive portions 113 causing the two conductive portions 113 to become electrically connected. In a preferred embodiment, the metal coating can be formed by electroplating in Step A2. The metal coating can be removed by laser engraving, chemical etching, or mechanical cutting in Step A3. The body in Step A4 can be made of metal, electrically conductive rubber, graphite or, alternatively, non-conducting materials having a coating of metal, electrically conductive rubber, or graphite.

Besides, in other embodiments, the portion of the second layer between the two recesses can be remained to form a protrusion in the middle of a groove, and the first conductive portion and the third conductive portion are electrically insulated from each other, which is a structure similar to that of FIG. 5A. As shown in FIG. 5A, when the protrusion remains in the groove, the method further includes disposing a corresponding recessed portion on the body. When the body is pressed, the protrusion is allowed to be inserted into the recessed portion, so that the body contacts the conductive portions causing the conductive portions to become electrically connected.

Figure 9:
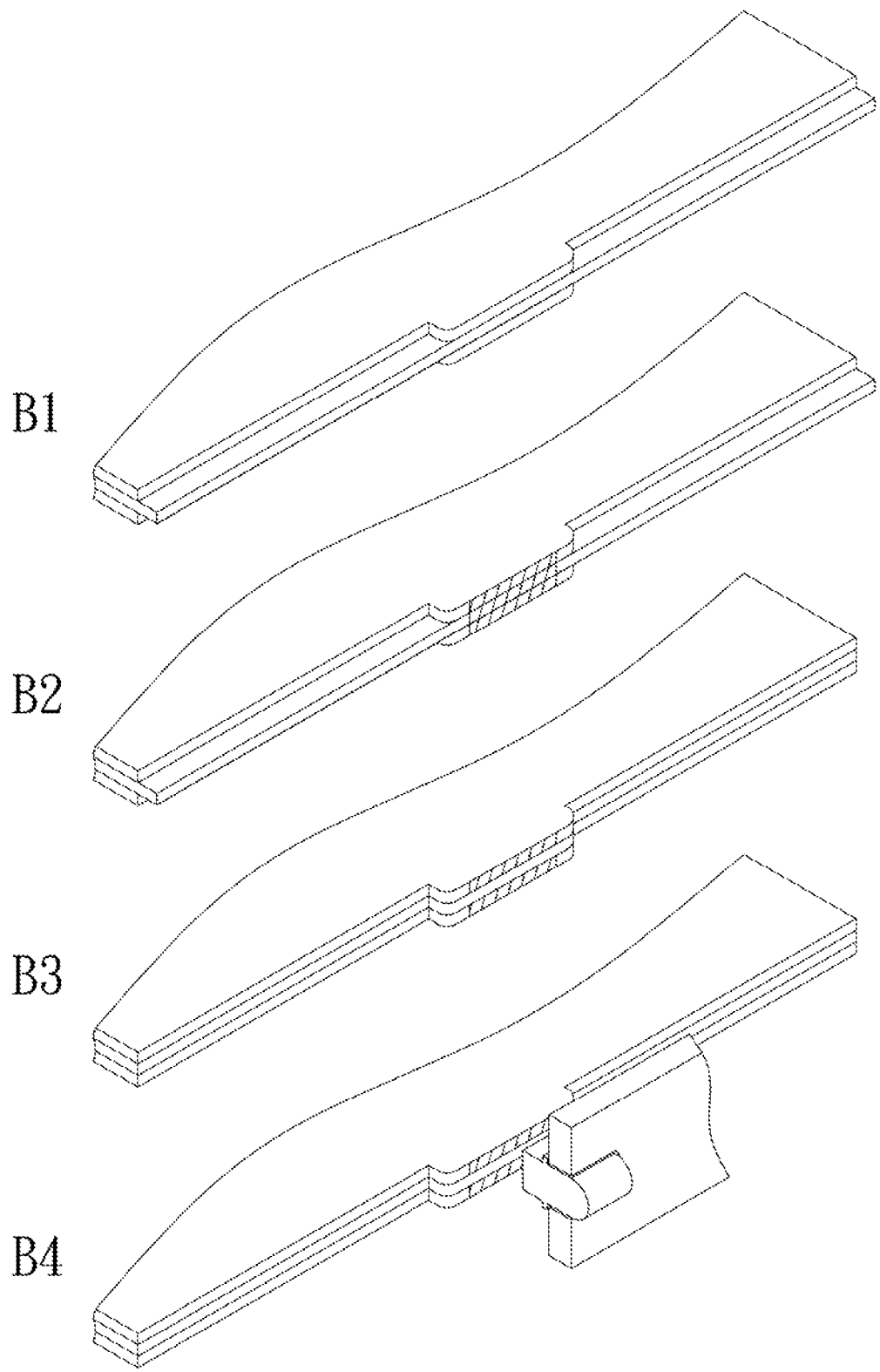
FIG. 9 shows a schematic view of a second exemplary method of manufacturing the circuit board of the invention.

FIG. 9 shows a schematic view of a second exemplary method of manufacturing the circuit board of the invention. As shown in FIG. 9, Step B1 includes stacking a first layer, a second layer, and a third layer, so that the second layer is sandwiched between the first layer and the third layer. A protrusion is provided on a sidewall of the first layer and the third layer, respectively. The protruded sidewalls of the first and the third layers are aligned with the second layer interposed therebetween to form a circuit board having a flange on the sidewall. Step B2 includes forming a metal coating on the sidewall of the circuit board. Step B3 includes removing a portion of the metal coating to remain a portion of the metal coating on the flange, so as to form a first conductive portion and a third conductive portion which are electrically insulated from each other. As shown in FIG. 9, in step B3, removing a portion of the metal coating may further include removing a portion of the second layer not corresponding to the first and the third layers, so that a circuit board similar to FIG. 4C can be formed. Step B4 includes adjusting the circuit board by disposing a movable unit (e.g. body 20) on a housing to correspond to the first conductive portion and the third conductive portion. When the body is pressed, the body contacts the first conductive portion and the third conductive portion, so that the first and the third conductive portions become electrically connected. In a preferred embodiment, the metal coating can be formed by electroplating in Step B2. The metal coating can be removed by laser engraving, chemical etching, or mechanical cutting in Step B3. The body in Step B4 can be made of metal, electrically conductive rubber, or graphite or, alternatively, non-conducting material having a coating of metal, electrically conductive rubber, or graphite.

Figure 10:
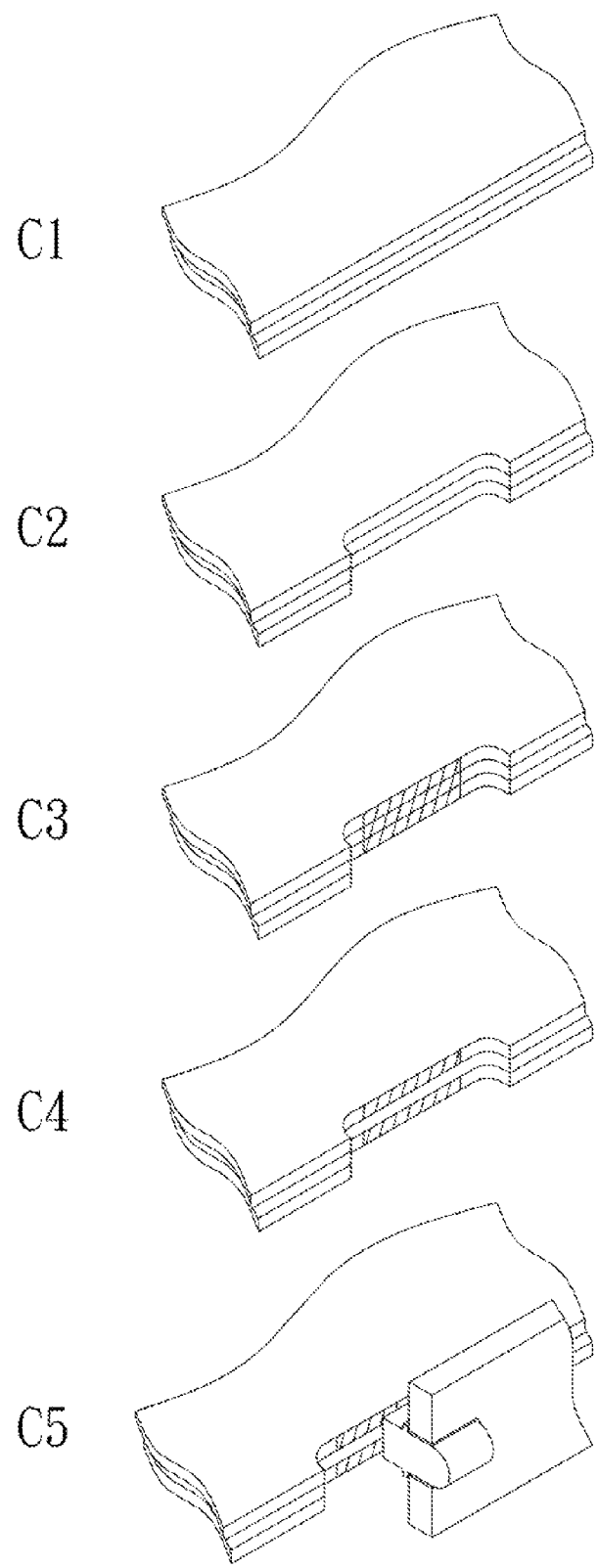
FIG. 10 shows a schematic view of a third exemplary method of manufacturing the circuit board of the invention.

FIG. 10 shows a schematic view of a third exemplary method of manufacturing the circuit board of the invention. As shown in FIG. 10, Step C1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step C2 includes perforating the sidewall of the circuit board to form a groove thereon. Step C3 includes forming a metal coating on the groove. Step C4 includes removing a portion of the metal coating to form a first conductive portion and a third conductive portion which are electrically insulated from each other. The first and the third conductive portions can be formed in the groove horizontally (as shown in FIG. 4A) or vertically (as shown in FIG. 4B). Step C5 includes adjusting the circuit board by disposing a movable unit (e.g. body 20) on a housing to correspond to the first and the third conductive portions. When the body is pressed, the body contacts the first and the third conductive portions, so that the first and the third conductive portions become electrically connected. In a preferred embodiment, the method of forming the groove in Step C2 is boring.

Figure 11:
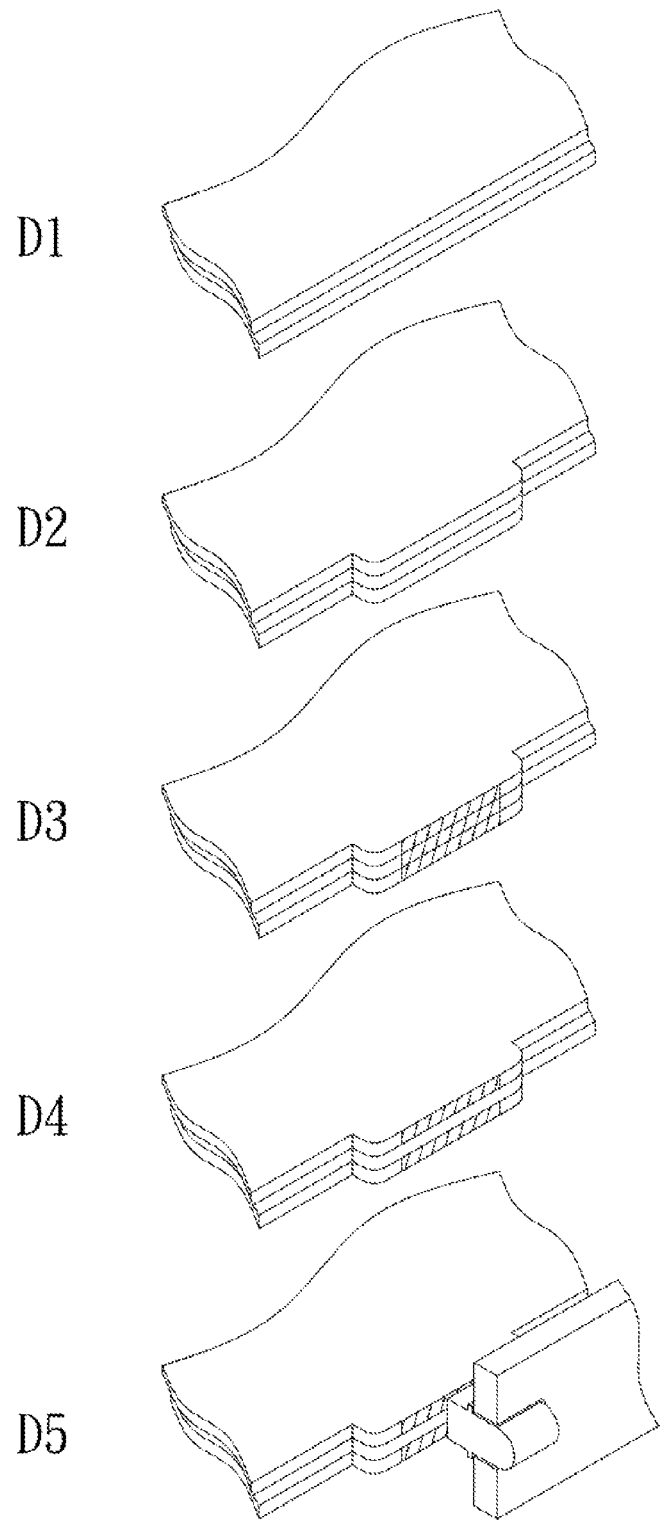
FIG. 11 shows a schematic view of a fourth exemplary method of manufacturing the circuit board of the invention.

FIG. 11 shows a schematic view of a fourth exemplary method of manufacturing the circuit board of the invention. As shown in FIG. 11, Step D1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step D2 includes perforating the sidewall of the circuit board to form a flange thereon by removing predefined portions of the circuit board to form the flange. Step D3 includes forming a metal coating on the flange. Step D4 includes removing a portion of the metal coating to form a first conductive portion and a third conductive portion which are electrically insulated from each other. The first and the third conductive portions can be formed on the flange horizontally (as shown in FIG. 4C) or vertically (as shown in FIG. 4B). Step D5 includes adjusting the circuit board by disposing a movable unit (e.g. body 20) on a housing to correspond to the first and the third conductive portions. When the body is pressed, the body contacts the first and the third conductive portions, so that the first and the third conductive portions become electrically connected. In a preferred embodiment, the method of forming the flange in Step D2 is boring.

Figure 12:
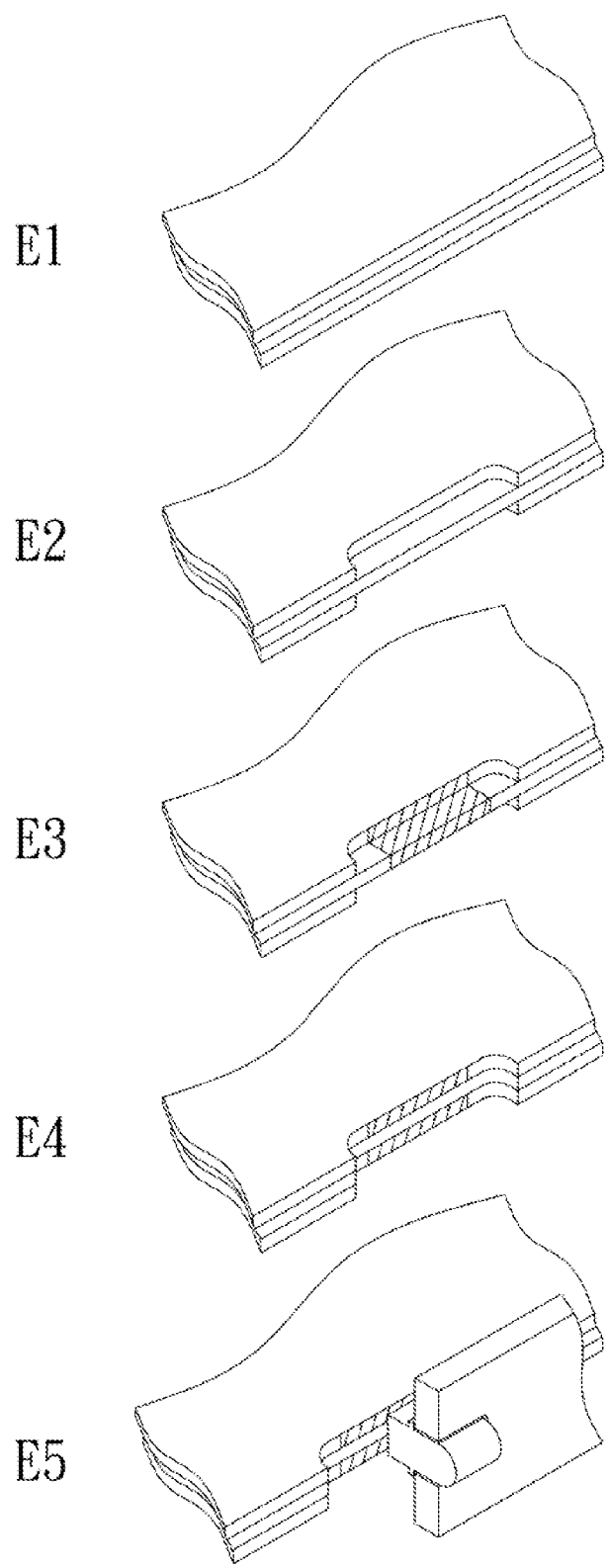
FIG. 12 shows a schematic view of a fifth exemplary method of manufacturing the circuit board of the invention.

FIG. 12 shows a schematic view of a fifth exemplary method of manufacturing the circuit board of the invention. As shown in FIG. 12, Step E1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step E2 includes forming at least two recesses on the sidewall of the circuit board. In this embodiment, the two recesses are formed on the upper edge and the lower edge of the sidewall of the circuit board which are opposite to each other by perforating the sidewalls of the first and the third layers, respectively. Step E3 includes forming a metal coating on the sidewall of the circuit board. Step E4 includes removing a portion of the metal coating to remain a portion of the metal coating in the recesses, so as to form the first and the third conductive portions which are electrically insulated from each other. Step E5 includes adjusting the circuit board by disposing a movable unit (e.g. body 20) on a housing to correspond to the first and the third conductive portions. When the body is pressed, the body contacts the first and the third conductive portions, so that the first and the third conductive portions become electrically connected. In a preferred embodiment, the method of forming the recesses in Step E2 is boring.

Figure 13:
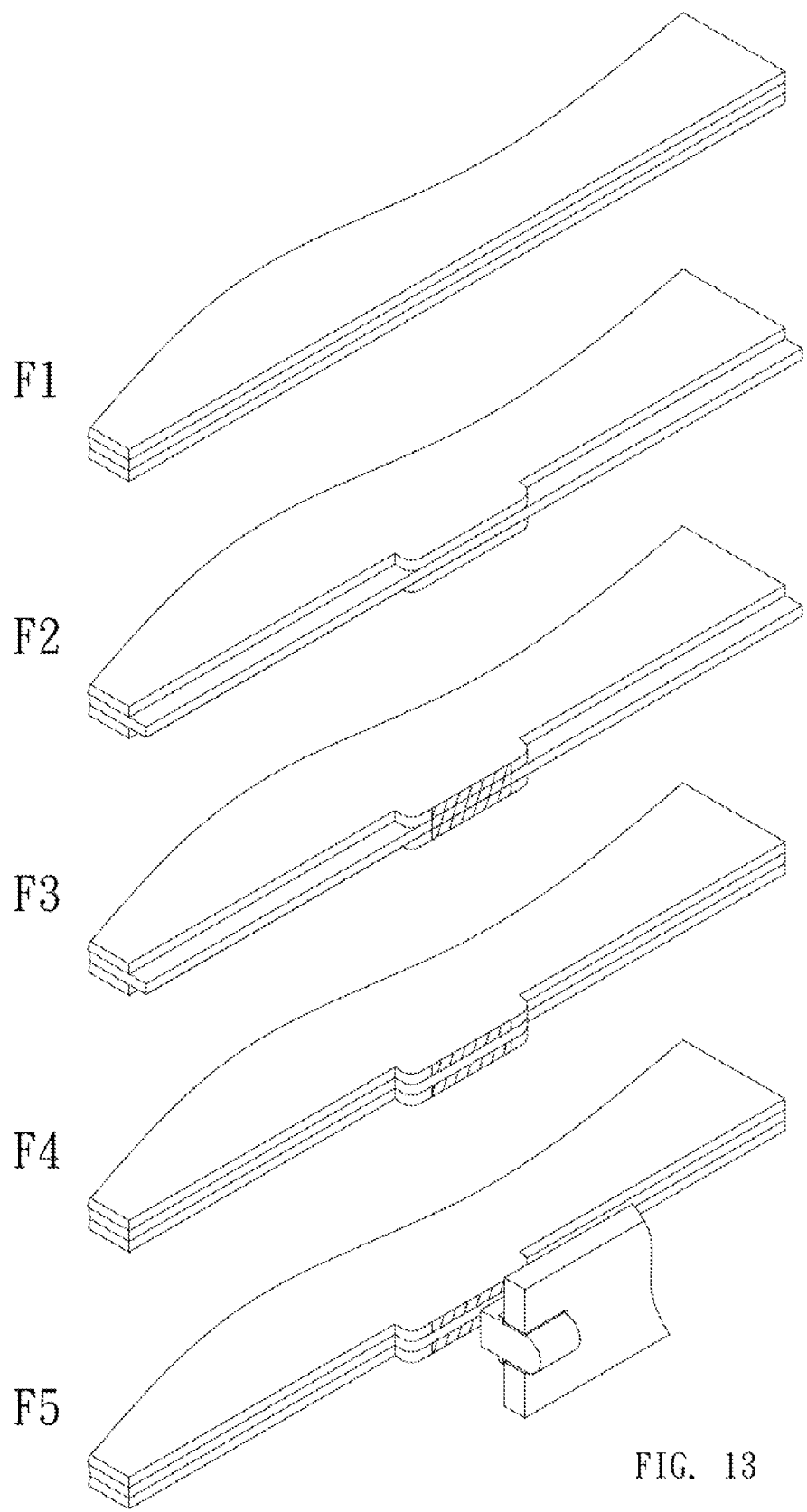
FIG. 13 shows a schematic view of a sixth exemplary method of manufacturing the circuit board of the invention.

FIG. 13 shows a schematic view of a sixth exemplary method of manufacturing the circuit board of the invention. As shown in FIG. 13, Step F1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step F2 includes forming at lease two flanges on the sidewall of the circuit board by removing the portions outside the flanges. In this embodiment, the two flanges are formed on the upper edge and the lower edge of the sidewall of the circuit board, which are opposite to each other, by perforating the sidewalls of the first and the third layers, respectively. Step F3 includes forming a metal coating on the sidewall of the circuit board. Step F4 includes removing a portion of the metal coating to remain a portion of the metal coating on the flange, so as to form a first conductive portion and a third conductive portion which are electrically insulated from each other. As shown in FIG. 13, in step F4, removing a portion of the metal coating may further include removing a portion of the second layer not corresponding to the first and the third layers, so that a circuit board similar to FIG. 4C can be formed. Step F5 includes adjusting the circuit board by disposing a movable unit (e.g. body 20) on a housing to correspond to the first and the third conductive portions. When the body is pressed, the body contacts the first and the third conductive portions, so that the first and the third conductive portions become electrically connected. In a preferred embodiment, the method of forming the protrusions in Step F2 is boring.

Figure 14:
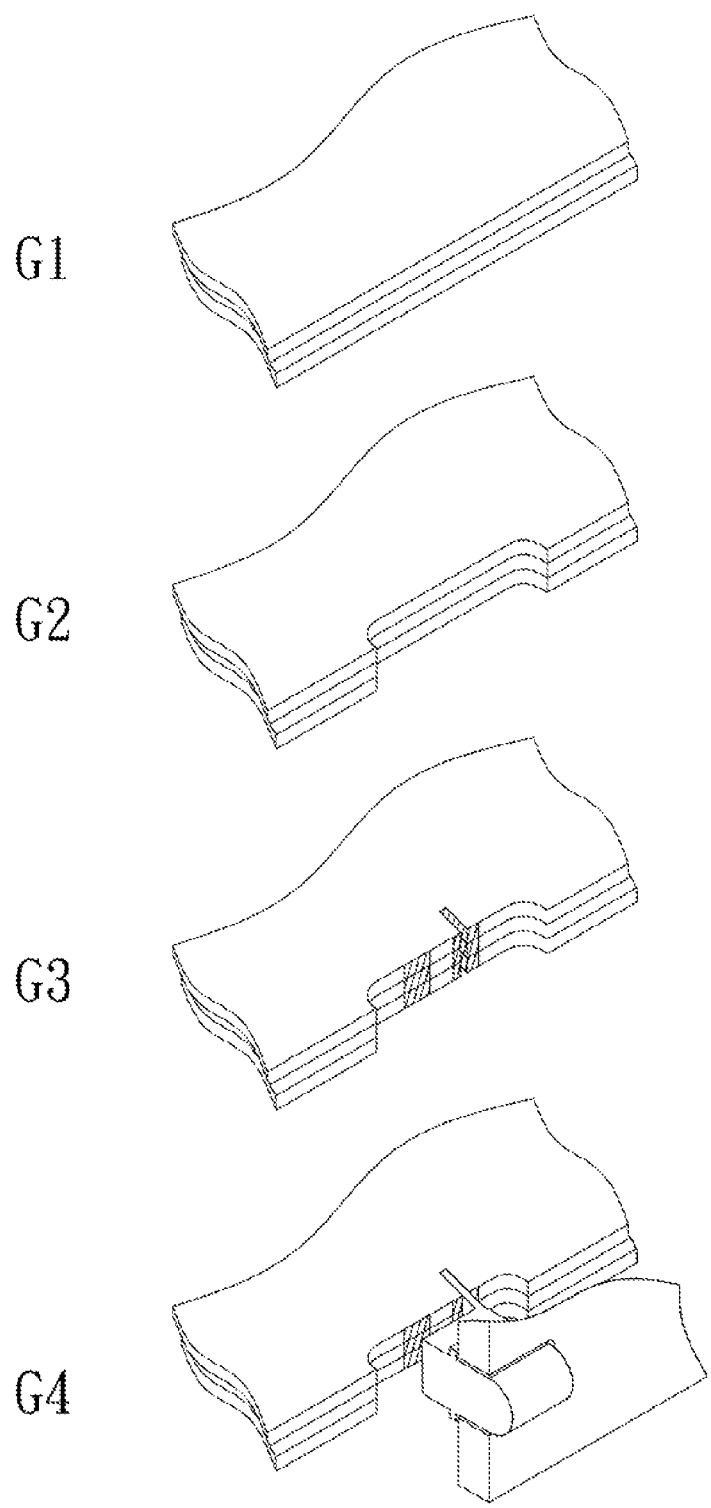
FIG. 14 shows a schematic view of a seventh exemplary method of manufacturing the circuit board of the invention.

FIG. 14 shows a schematic view of a seventh exemplary method of manufacturing the circuit board of the invention. As shown in FIG. 14, Step G1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step G2 includes perforating the sidewall of the circuit board to form a groove thereon. Step G3 includes forming a first conductive portion and a third conductive portion which are electrically insulated from each other in the groove. Step G4 includes adjusting the circuit board by disposing a movable unit (e.g. body 20) on a housing, so that a portion of the body is connected to one of the first and the third conductive portions. When the body is pressed, the body contacts the other one of the first and the third conductive portions, so that the first and the third conductive portions become electrically connected. In a preferred embodiment, the first and the third conductive portions can be formed by electroplating in Step G3.

Figure 15:
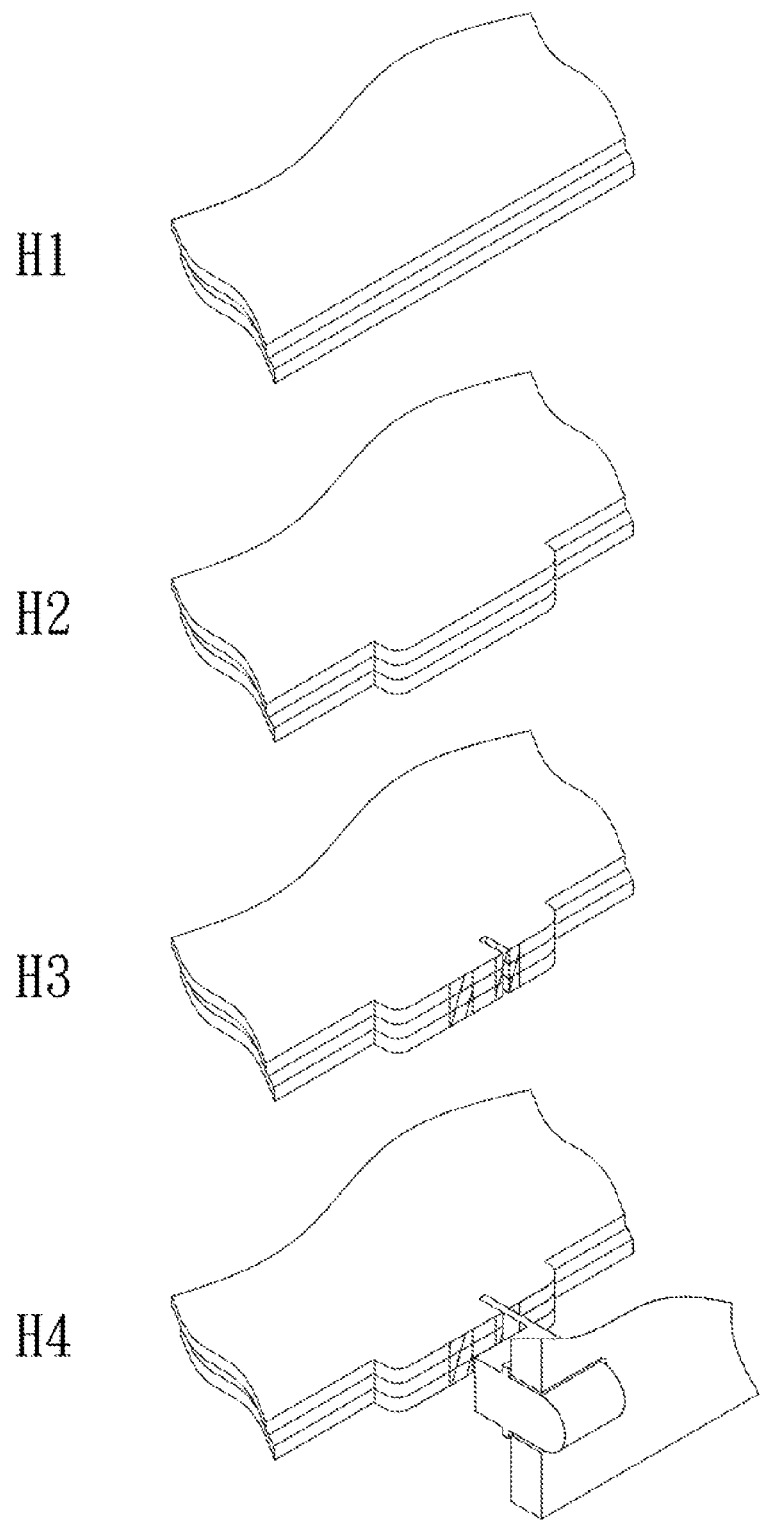
FIG. 15 shows a schematic view of an eighth exemplary method of manufacturing the circuit board of the invention.

FIG. 15 shows a schematic view of an eighth exemplary method of manufacturing the circuit board of the invention. As shown in FIG. 15, Step H1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step H2 includes perforating the sidewall of the circuit board to form a flange thereon by removing predefined portions outside the flange. Step H3 includes forming a first conductive portion and a third conductive portion which are electrically insulated from each other on the flange. Step H4 includes adjusting the circuit board by disposing a movable unit (e.g. body 20) on a housing, so that a portion of the body is connected to one of the first and the third conductive portions. When the body is pressed, the body contacts the other one of the first and the third conductive portions, so that the first and the third conductive portions become electrically connected. In a preferred embodiment, the first and the third conductive portions can be formed by electroplating in Step H3.

Figure 16:
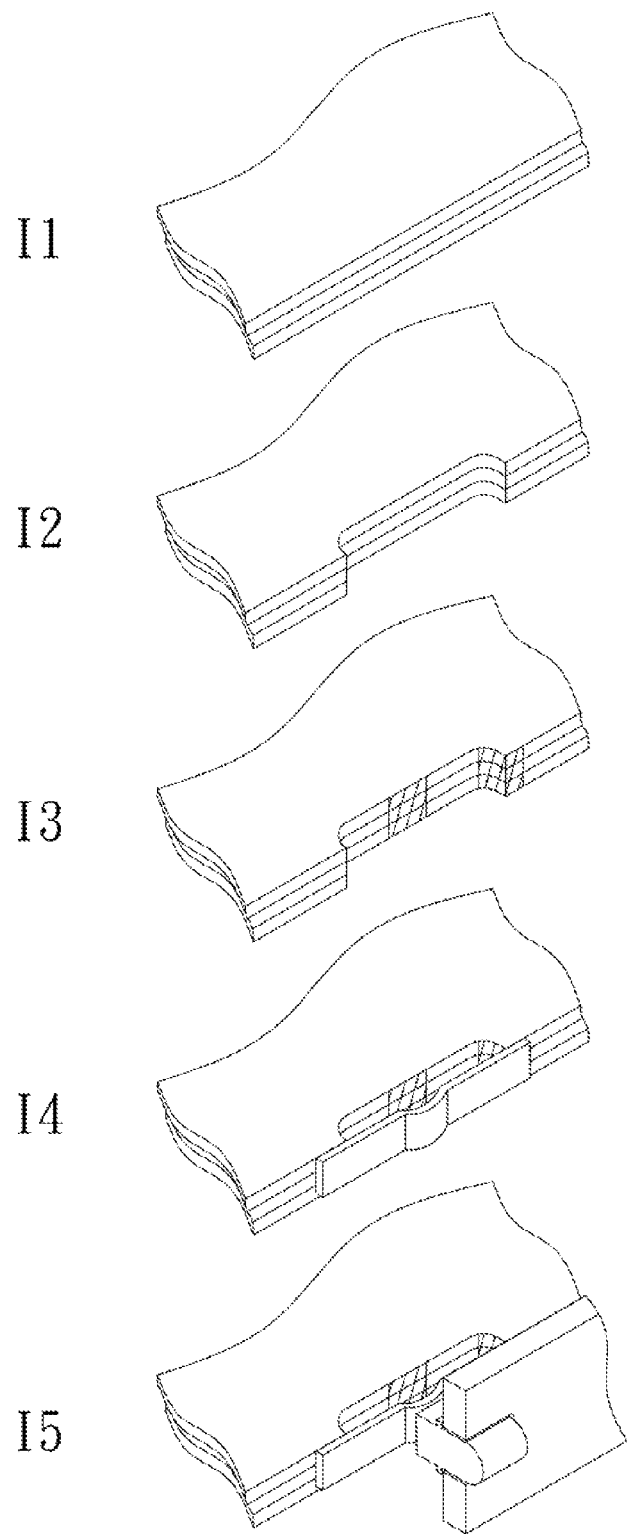
FIG. 16 shows a schematic view of a ninth exemplary method of manufacturing the circuit board of the invention.

FIG. 16 shows a schematic view of a ninth exemplary method of manufacturing the circuit board of the invention. As shown in FIG. 16, Step 11 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step 12 includes perforating the sidewall of the circuit board to form a groove thereon. Step 13 includes forming a first conductive portion and a third conductive portion which are electrically insulated from each other in the groove. Step 14 includes disposing a metal plate corresponding to the groove, so that one end of the metal plate is electrically connected to one of the first and the third conductive portions while the other end is fixed on the sidewall of the circuit board by soldering or other methods. Step 15 includes adjusting the circuit board by disposing a body corresponding to the metal plate on a housing. When the body is pressed, the metal plate is deformed to contact the other one of the first and the third conductive portions, so that the first and the third conductive portions become electrically connected. As shown in FIG. 7B and FIG. 7C, pressing the body 20 causes the metal plate 21 to deform and therefore moves from the first position $P_1$ to the second position $P_2$, so that the metal plate 21 contacts the other one of the two conductive portions 113 causing the two conductive portions 113 to become electrically connected.

Figure 17:
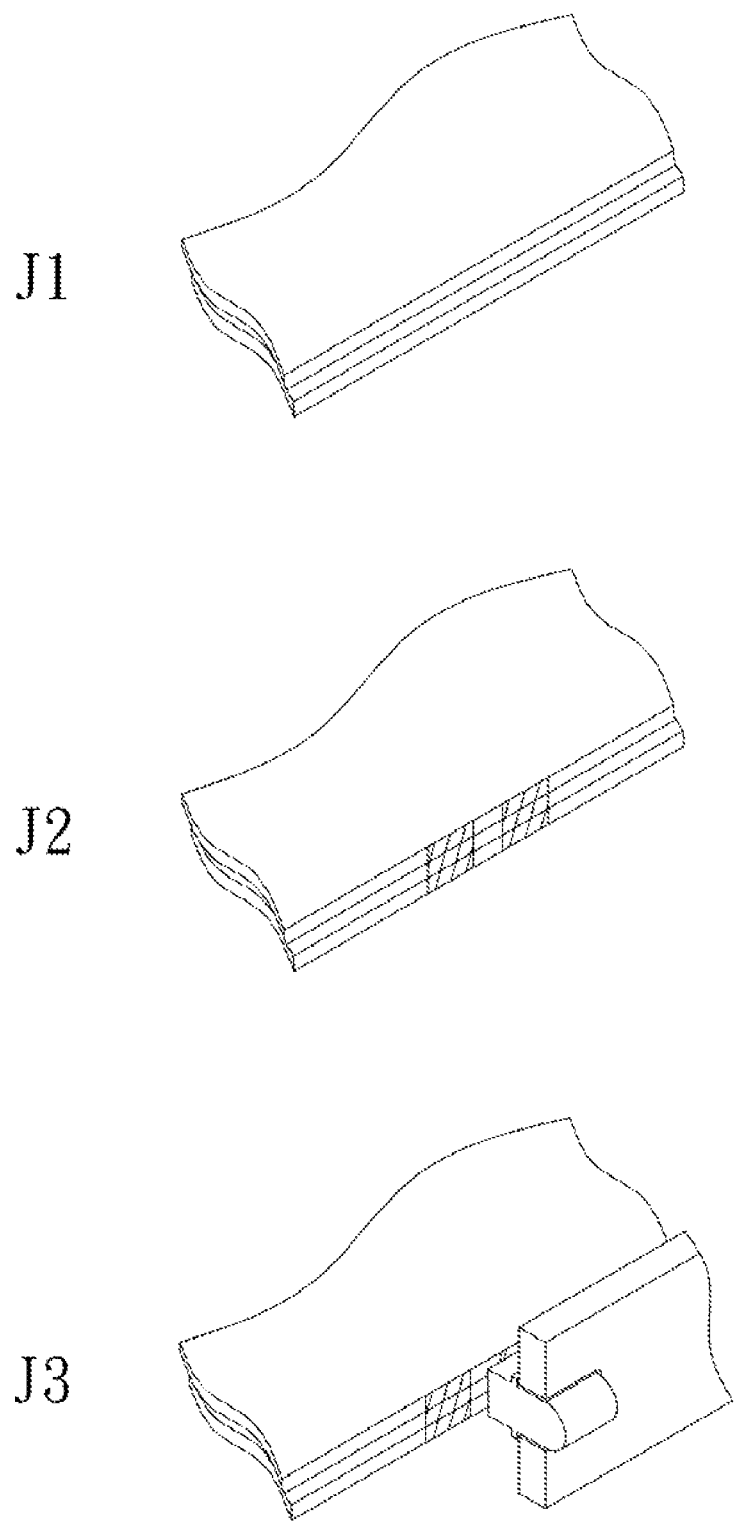
FIG. 17 shows a schematic view of a tenth exemplary method of manufacturing the circuit board of the invention.

FIG. 17 shows a schematic view of a tenth exemplary method of manufacturing the circuit board of the invention. As shown in FIG. 17, Step J1 includes providing a circuit board. The circuit board is composed of a first layer, a second layer, and a third layer. The three layers are disposed in a stack manner, so that the second layer is sandwiched between the first layer and the third layer, and a sidewall of each of the layers jointly forms a sidewall of the circuit board. Step J2 includes forming a first and a third conductive portions which are electrically insulated from each other on the sidewall of the circuit board. The first and the third layers can be formed on the sidewall of the circuit board horizontally (as shown in FIG. 4E) or vertically (as shown in FIG. 4F). Step J3 includes adjusting the circuit board by disposing a movable unit (e.g. body 20) on a housing to correspond to the first and the third conductive portions. When the body is pressed, the body contacts the first and the third conductive portions, so that the first and the third conductive portions become electrically connected. In a preferred embodiment, the first and the third conductive portions can be formed by electroplating in Step J2.

It should be noticed that although this invention is illustrated by the embodiments showing the circuit board composed of stacked circuit layers, a single layer circuit board having different circuit layers on its upper and lower surfaces can be adopted. Furthermore, through variations in design of different circuit layers, the conductive portions of the switch structure can be directly formed on the sidewall of the circuit board by utilizing the structural design, so as to form an embedded circuit board switch. According to the invention, the required space for mounting the circuit board switch and the restrictions on designing the rigid-flexible printed circuit board can therefore be overcome, and the switch structure of the above embodiments utilizing the structural design of the circuit board are provided to maximize the space usability of the circuit board.

Although the present invention has been described through the above-mentioned related embodiments, the above-mentioned embodiments are merely the examples for practicing the present invention. What need to be indicated is that the disclosed embodiments are not intended to limit the scope of the present invention. On the contrary, the modifications within the essence and the scope of the claims and their equivalent dispositions are all contained in the scope of the present invention.

What is claimed is:

1. A switch device for use in an electronic device, comprising:
    a circuit board including a sidewall, the circuit board formed from a first layer, a second layer, and a third layer stacked in sequence;
    a plurality of conductive portions formed on the sidewall, wherein the plurality of conductive portions are electrically insulated from each other by the second layer; and
    a movable unit including at least a conducting part and moving between a first position and a second position, wherein when the conducting part of the movable unit is at the first position, the plurality of conductive portions remain electrically insulated from each other; when the conducting part of the movable unit is at the second position, at least two of the plurality of conductive portions are electrically connected via the conducting part.

2. The switch device of claim 1, wherein the conducting part includes a metal plate, when the movable unit is at the first position, the metal plate is electrically connected to one of the plurality of conductive portions, when the movable unit moves to the second position, the metal plate is deformed to cause the at least two of the plurality of conductive portions to be electrically connected.

3. The switch device of claim 1, wherein the movable unit includes a body, the conducting part is a conductive surface on the body.

4. The switch device of claim 3, wherein the body is made of a non-conducting material.

5. The switch device of claim 1, wherein the movable unit includes a body, the conducting part is formed as a conductive element connected to the body.

6. The switch device of claim 5, wherein the conductive element is a conductive layer coated on the body.

7. The switch device of claim 5, wherein the conductive element is a metal plate attached to the body.

8. The switch device of claim 1, wherein a groove is formed on the sidewall of the circuit board, the plurality of conductive portions are formed in the groove.

9. The switch device of claim 8, wherein the movable unit includes a body, the conducting part includes a metal plate, the metal plate is disposed on the sidewall of the circuit board corresponding to the groove.

10. The switch device of claim 9, further comprising a protrusion in the groove, the movable unit including a body having a recessed portion, wherein the recessed portion is shaped corresponding to the shape of the protrusion, the conducting part is disposed on the recessed portion.

11. The switch device of claim 1, wherein the sidewall of the circuit board is formed with a flange, the plurality of conductive portions are formed on the flange.

12. The switch device of claim 11, wherein the movable unit includes a body, the conducting part includes a metal plate, the metal plate is disposed on the sidewall of the circuit board corresponding to the flange.

13. The switch device of claim 1, wherein the circuit board is composed of a plurality of circuit layers.

14. The switch device of claim 13, wherein the plurality of conductive portions are respectively formed on at least one of the sidewalls of the plurality of circuit layers, and the plurality of the conductive portions are electrically isolated from each other.

15. The switch device of claim 1, wherein the movable unit includes a body movably mounted on a housing, the conducting part is disposed in the housing corresponding to the plurality of conductive portions.

16. The switch device of claim 15, wherein the body is made of a material selected from the group of metal, electrically conductive rubber, and graphite.

17. A method for manufacturing a switch device, comprising:
    stacking a first layer, a second layer, and a third layer to form a circuit board with the second layer sandwiched between the first layer and the third layer, wherein sidewalls of the first layer, the second layer, and the third layer jointly form a sidewall of the circuit board;
    forming a first conductive portion and a third conductive portion on the sidewalls of the first layer and the third layer, respectively by forming at least a flange on the sidewall of the circuit board and forming the first conductive portion and the third conductive portion on the flange, wherein the flange is formed with a protrusion on each of the sidewalls of the first layer and the third layer; and adjusting the circuit board, so that the first conductive portion and the third conductive portion is selectively electrically connected and disconnected.

18. The method of claim 17, wherein the step of forming the protrusion on each of the sidewalls of the first layer and the third layer is performed before or after the step of stacking.

19. The method of claim 17, wherein the step of forming the first conductive portion and the third conductive portion comprises:
   forming a metal coating on the flange of the circuit board; and
   removing a portion of the metal coating to form the first conductive portion and the third conductive portion.

20. The method of claim 19, wherein the method of removing the metal coating comprises laser engraving, chemical etching, or mechanical cutting.

21. The method of claim 17, wherein the step of adjusting the circuit board comprises providing a movable unit including a conducting part, so that when the conducting part of the movable unit is at a first position, the first conductive portion and the third conductive portion are electrically disconnected, when the conducting part of the movable unit is at a second position, the first conductive portion and the third conductive portion are electrically connected via the conducting part.

22. The method of claim 21, wherein the movable unit includes a body, the conducting part includes a metal plate, the method further comprises electrically connecting the metal plate to one of the first conductive portion and the third conductive portion, so that when the movable unit moves to the second position, the metal plate is deformed to cause the first conductive portion and the third conductive portion to become electrically connected.

23. The method of claim 17, wherein the step of forming the first conductive portion and the third conductive portion comprises:
   forming at least a groove on the sidewall of the circuit board; and
   forming the first conductive portion and the third conductive portion in the groove.

24. The method of claim 23, wherein the first conductive portion and the third conductive portion are respectively formed on at least one of the sidewalls of the first layer and the third layer in the groove and electrically isolated from each other.

25. The method of claim 23, wherein the step of forming the first conductive portion and the third conductive portion comprises:
   forming a metal coating on the groove of the circuit board; and
   removing a portion of the metal coating to form the first conductive portion and the third conductive portion.

26. The method of claim 23, wherein the step of forming the groove further comprises remaining a protrusion in the groove, the step of adjusting the circuit board comprises providing a movable unit, the movable unit includes a body and a conducting part, the method further comprises forming a recessed portion on the body, so that the recessed portion is shaped corresponding to the shape of the protrusion, when the conducting part of the movable unit is at a first position, the first conductive portion and the third conductive portion are electrically disconnected from each other; when the conducting part of the movable unit is at a second position, the first conductive portion and the third conductive portion are electrically connected via the conducting part.

27. The method of claim 23, wherein the first and third conductive portions are respectively formed on at least one of the sidewalls of the first layer and the third layer on the flange and electrically isolated from each other.

28. The method of claim 23, wherein the step of forming the groove on the sidewall of the circuit board comprises forming a recess on each of the sidewalls of the first layer and the third layer.

29. The method of claim 28, wherein the step of forming the recess on each of the sidewalls of the first layer and the third layer is performed before or after the step of stacking.

30. The method of claim 28, wherein the step of forming the first conductive portion and the third conductive portion comprises:
   forming a metal coating on the sidewall of the circuit board; and
   removing a portion of the metal coating to retain a portion of the metal coating in the recesses, so as to form the first conductive portion and the third conductive portion.

* * * * *